(12) United States Patent
Yamada et al.

(10) Patent No.: US 9,112,035 B2
(45) Date of Patent: Aug. 18, 2015

(54) SEMICONDUCTOR SUBSTRATE, FIELD-EFFECT TRANSISTOR, INTEGRATED CIRCUIT, AND METHOD FOR FABRICATING SEMICONDUCTOR SUBSTRATE

(75) Inventors: Hisashi Yamada, Tsukuba (JP); Masahiko Hata, Tsukuba (JP); Masafumi Yokoyama, Bunkyo-ku (JP); Mitsuru Takenaka, Bunkyo-ku (JP); Shinichi Takagi, Bunkyo-ku (JP); Tetsuji Yasuda, Tsukuba (JP); Hideki Takagi, Tsukuba (JP); Yuji Urabe, Tsukuba (JP)

(73) Assignees: SUMITOMO CHEMICAL COMPANY, LIMITED, Tokyo (JP); THE UNIVERSITY OF TOKYO, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 13/410,872

(22) Filed: Mar. 2, 2012

(65) Prior Publication Data

US 2012/0205747 A1    Aug. 16, 2012

Related U.S. Application Data

(63) Continuation-in-part of application No. PCT/JP2010/065174, filed on Sep. 3, 2010.

(30) Foreign Application Priority Data

Sep. 4, 2009  (JP) ................. 2009-205311
Mar. 2, 2010  (JP) ................. 2010-045498
Jun. 14, 2010 (JP) ................. 2010-135570

(51) Int. Cl.
*H01L 29/02*    (2006.01)
*H01L 29/786*   (2006.01)
(Continued)

(52) U.S. Cl.
CPC .... *H01L 29/78681* (2013.01); *H01L 21/76251* (2013.01); *H01L 21/76256* (2013.01); *H01L 29/4966* (2013.01); *H01L 29/517* (2013.01); *H01L 29/66742* (2013.01)

(58) Field of Classification Search
CPC ............. H01L 29/4966; H01L 29/517; H01L 21/76251; H01L 29/66742; H01L 29/78681
USPC .......... 257/183, 190, E29.083, 632, 368, 288; 438/478
See application file for complete search history.

(56) References Cited

U.S. PATENT DOCUMENTS 5,164,805 A * 11/1992 Lee .............................. 257/351
5,393,680 A    2/1995 Shikata
(Continued)

FOREIGN PATENT DOCUMENTS

CN   1366331 A   8/2002
JP   4-91435 A   3/1992
(Continued)

OTHER PUBLICATIONS

G. Eftekhari, Electrical properties of sulfur-passivated III-V compound devices, 2002, Pergamon, Vacuum 67 (2002) 81-90.*
(Continued)

*Primary Examiner* — William F Kraig
*Assistant Examiner* — Pavel Ivanov
(74) *Attorney, Agent, or Firm* — Sughrue Mion, PLLC

(57) ABSTRACT

A semiconductor substrate includes a substrate, an insulating layer, and a semiconductor layer. The insulating layer is over and in contact with the substrate. The insulating layer includes at least one of an amorphous metal oxide and an amorphous metal nitride. The semiconductor layer is over and in contact with the insulating layer. The semiconductor layer is formed by crystal growth.

10 Claims, 32 Drawing Sheets

(51) Int. Cl.
*H01L 21/762* (2006.01)
*H01L 29/49* (2006.01)
*H01L 29/51* (2006.01)
*H01L 29/66* (2006.01)

(56) References Cited

U.S. PATENT DOCUMENTS

| | | | | |
|---|---|---|---|---|
| 5,986,291 | A * | 11/1999 | Currie et al. | 257/194 |
| 6,030,884 | A * | 2/2000 | Mori | 438/455 |
| 6,408,015 | B1 * | 6/2002 | Kaneko | 372/50.1 |
| 6,410,941 | B1 * | 6/2002 | Taylor et al. | 257/84 |
| 6,893,936 | B1 | 5/2005 | Chen et al. | |
| 7,498,229 | B1 * | 3/2009 | Atanackovic | 438/311 |
| 2002/0074546 | A1 * | 6/2002 | Sekine | 257/52 |
| 2002/0094663 | A1 | 7/2002 | Kwon et al. | |
| 2003/0227033 | A1 | 12/2003 | Ahn et al. | |
| 2005/0023624 | A1 * | 2/2005 | Ahn et al. | 257/410 |
| 2005/0070070 | A1 | 3/2005 | Rim | |
| 2007/0252216 | A1 * | 11/2007 | Muhammad | 257/369 |
| 2008/0096383 | A1 * | 4/2008 | Tigelaar et al. | 438/652 |
| 2010/0276723 | A1 | 11/2010 | Utsumi et al. | |

FOREIGN PATENT DOCUMENTS

| | | | |
|---|---|---|---|
| JP | 2001-284596 | A | 10/2001 |
| JP | 2002-231910 | A | 8/2002 |
| JP | 2005-183597 | A | 7/2005 |
| JP | 2005-529492 | A | 9/2005 |
| JP | 2006-121091 | A | 5/2006 |
| JP | 2007-173694 | * | 7/2007 |
| JP | 2007-173694 | A | 7/2007 |
| JP | 2007-329470 | A | 12/2007 |
| JP | 2008-505482 | A | 2/2008 |
| JP | 2009-117707 | A | 5/2009 |
| TW | 200927636 | A | 7/2009 |

OTHER PUBLICATIONS

Larsen, TA, Electrically Alterable GaAs MIS FET Devices, Jun. 1, 1985, IBM, IBM Technical Disclosure Bulletin, vol. 28, Jun. 1985, US, (Jun. 1, 1985), pp. 196-197, Cross Reference: 0018-8689-28-1-196.*

Hiroyuki Ishii et al., High Electron Mobility Metal-Insulator-Semiconductor Field-Effect Transistors Fabricated on (111)-Oriented InGaAs Channels, Published Nov. 27, 2009, Japan Society of Applied Physics, Applied Physics Express (APEX), 2 (2009) 121101-1 to 121101-3.*

F. Ren, et al., "Demonstration of Enhancement-mode *p*- and *n*-Channel GaAs MOSFETs with $Ga_2O_3(Gd_2O_3)$ as Gate Oxide", Solid-State Electronics, vol. 41, No. 11, 1997, pp. 1751-1753.

F. Ren, et al., "$Ga_2O_3(Gd_2O_3)$/InGaAs Enhancement-Mode n-Channel MOSFET's", IEEE Electron Device Letters, vol. 19, No. 8, Aug. 1998, pp. 309-311.

P.D. Ye, et al., "GaAs MOSFET With Oxide Gate Dielectric Grown by Atomic Layer Deposition", IEEE Electron Device Letters, vol. 24, No. 4, Apr. 2003, pp. 209-211.

P.D. Ye, et al., "GaAs metal-oxide-semiconductor field-effect transistor with nanometer-thin dielectric grown by atomic layer deposition", Applied Physics Letters, vol. 83, No. 1, Jul. 7, 2003, pp. 180-182.

P.D. Ye, et al., "Depletion-mode InGaAs metal-oxide-semiconductor field-effect transistor with oxide gate dielectric grown by atomic-layer deposition", Applied Physics Letters, vol. 84, No. 3, Jan. 19, 2004, pp. 434-436.

Karthik Rajagopalan, et al., "Enhancement-Mode GaAs n-Channel MOSFET", IEEE Electron Device Letters, vol. 27, No. 12, Dec. 2006, pp. 959-962.

S. Oktyabrsky, et al., "High-k gate stack on GaAs and InGaAs using in situ passivation with amorphous silicon", Materials Science and Engineering B, vol. 135, 2006, pp. 272-276.

Y. Xuan, et al., "Submicrometer Inversion-Type Enhancement-Mode InGaAs MOSFET With Atomic-Layer-Deposited $Al_2O_3$ as Gate Dielectric", IEEE Electron Device Letters, vol. 28, No. 11, Nov. 2007, pp. 935-938.

Y.Q. Wu, et al., "Enhancement-mode InP *n*-channel metal-oxide-semiconductor field-effect transistors with atomic-layer-deposited $Al_2O_3$ dielectrics", Applied Physics Letters, vol. 91, 2007, pp. 022108-1-022108-3.

F. Zhu, et al., "Depletion-mode GaAs metal-oxide-semiconductor field-effect transistor with amorphous silicon interface passivation layer and thin $HfO_2$ gate oxide", Applied Physics Letters, vol. 91, 2007, pp. 043507-1-043507-3.

Ning Li, et al., "Properties of InAs metal-oxide-semiconductor structures with atomic-layer-deposited $Al_2O_3$ Dielectric", Applied Physics Letters, vol. 92, 2008, pp. 143507-1-143507-3.

J.Q. Lin, et al., "Inversion-Mode Self-Aligned $In_{0.53}Ga_{0.47}As$ N-Channel Metal-Oxide-Semiconductor Field-Effect Transistor With HfAlO Gate Dielectric and TaN Metal Gate", IEEE Electron Device Letters, vol. 29, No. 9, Sep. 2008, pp. 977-980.

Hock-Chun Chin, et al., "Silane-Ammonia Surface Passivation for Gallium Arsenide Surface-Channel n-MOSFETs", IEEE Electron Device Letters, 2009, pp. 1-3.

Masafumi Yokoyama, et al., "III-V-semiconductor-on-insulator *n*-channel metal-insulator-semiconductor field-effect transistors with buried $Al_2O_3$ layers and sulfur passivation: Reduction in carrier scattering at the bottom interface", Applied Physics Letters, vol. 96, 2010, pp. 142106-1-142016-3.

First Office Action issued Jan. 16, 2014 in corresponding Chinese Patent Application No. 201080038691.4 with English translation.

Notice of Reasons for Refusal issued Apr. 7, 2014 in corresponding Japanese Patent Application No. 2010-198172 with English translation.

Second Office Action issued Sep. 10, 2014 in counterpart Chinese Patent Application No. 201080038691.4.

Communication from Japanese Patent Office issued Nov. 11, 2014 in a counterpart Japanese Application No. 2010-198172.

Notice of Reasons for Refusal issued Feb. 26, 2015 in corresponding Taiwanese Patent Application No. 099130017 with partial translation.

* cited by examiner

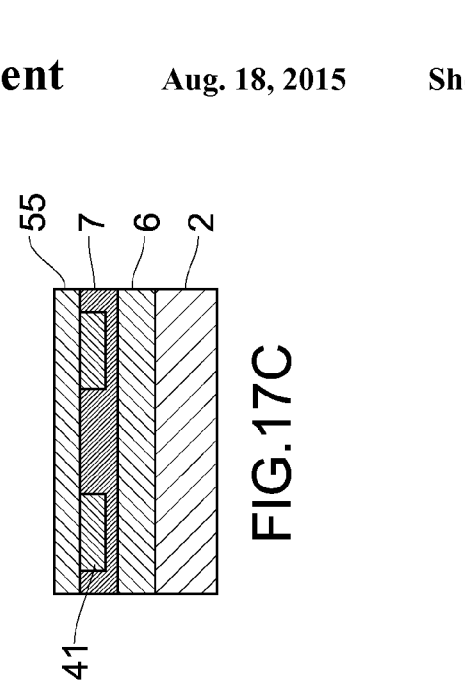
FIG.17A FIG.17B FIG.17C
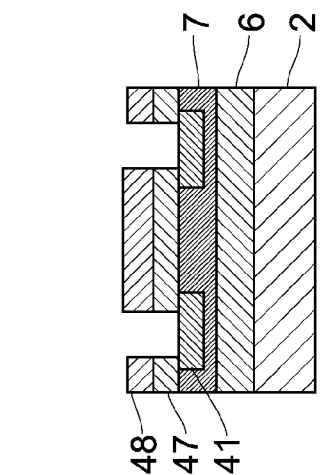
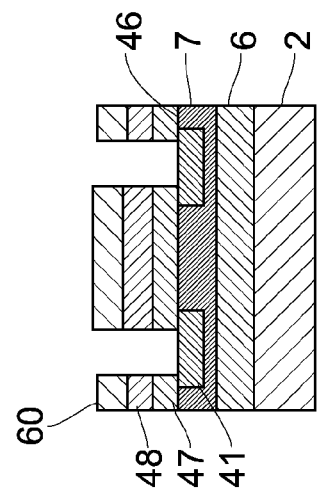
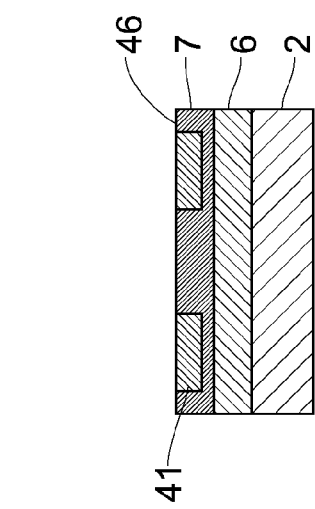
FIG.17D FIG.17E FIG.17F

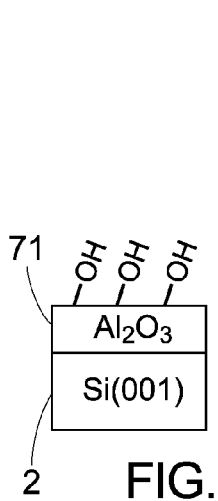 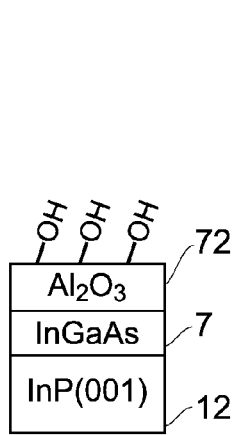 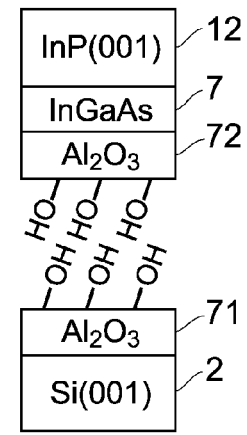 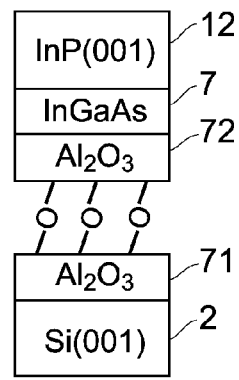
FIG.24A  FIG.24B  FIG.24C
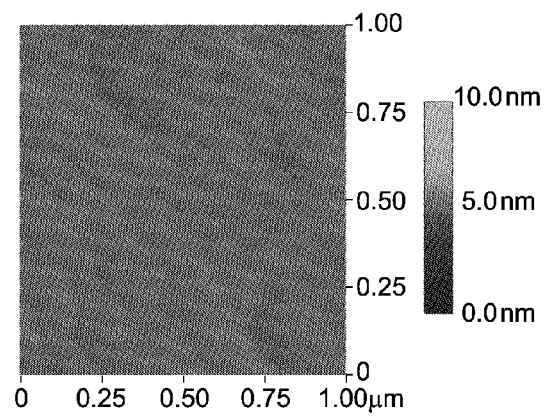
FIG.25
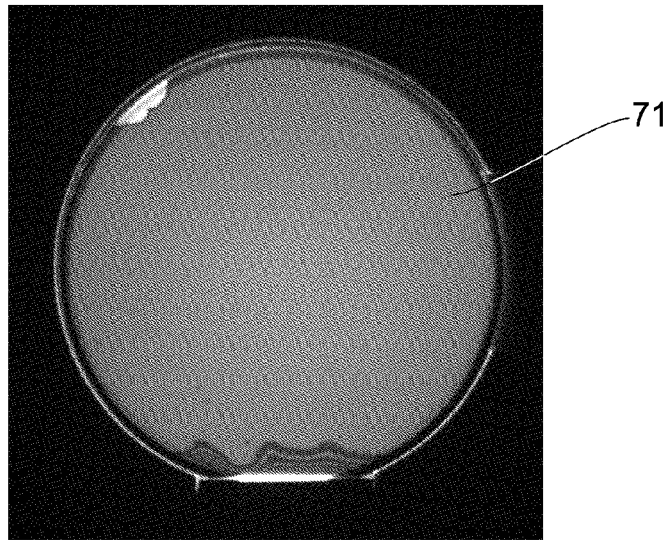
FIG.26

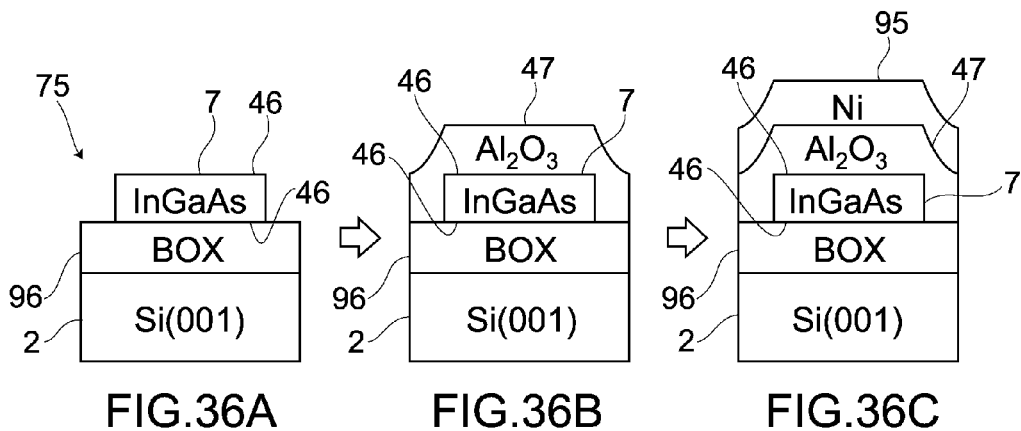
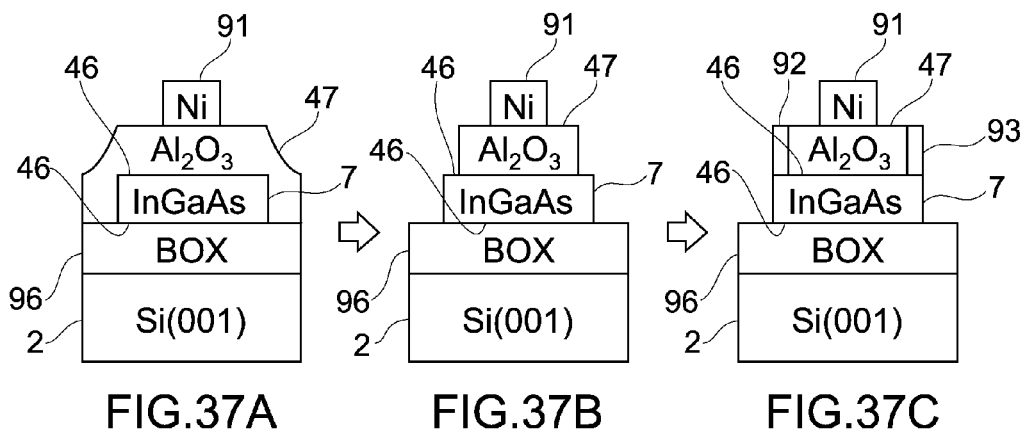

ent No. 2009-205311, filed Sep. 4, 2009, Japanese Patent
SEMICONDUCTOR SUBSTRATE, FIELD-EFFECT TRANSISTOR, INTEGRATED CIRCUIT, AND METHOD FOR FABRICATING SEMICONDUCTOR SUBSTRATE

CROSS-REFERENCE TO RELATED APPLICATIONS

The present application is a continuation application of International Application No. PCT/JP2010/065174, filed Sep. 3, 2010, which claims priority to Japanese Patent Application No. 2009-205311, filed Sep. 4, 2009, Japanese Patent Application No. 2010-045498, filed Mar. 2, 2010, and Japanese Patent Application No. 2010-135570, filed Jun. 14, 2010. The contents of these applications are incorporated herein by reference in their entirety.

BACKGROUND OF THE INVENTION

1. Field of the Invention

The present invention relates to a semiconductor substrate, a field-effect transistor, an integrated circuit, and a method for fabricating the semiconductor substrate.

2. Discussion of the Background

Group III-V compound semiconductor layers, due to their high carrier mobility, have been conventionally considered as promising replacements for silicon (Si) CMOS transistors. Specifically, MISFET with a group III-V compound semiconductor layer as a channel layer over a Si substrate has high carrier mobility and low carrier effective mass. As such, MISFET has been expected as a circuit element that could provide improvements over the characteristics to existing downsized Si CMOS transistors.

For example, see Ren, F. et al. "Demonstration of enhancement-mode p- and n-channel GaAs MOSFETs with $Ga_2O_3$ $(Gd_2O_3)$As gate oxide." *Solid State Electron*, 41, pp. 1751-1753 (1997); Ren, F. et al. "$Ga_2O_3(Gd_2O_3)$/InGaAs enhancement-mode n-channel MOSFET's." *IEEE Electron Device Lett.*, 19, pp. 309-311 (1998); Ye, P. D. et al. "GaAs MOSFET with oxide gate dielectric grown by atomic-layer-deposition." *IEEE Electron Device Lett.*, 24, pp. 209-211 (2003); Ye, P. D. et al. "GaAs metal-oxide-semiconductor field-effect transistor with nanometer-thin dielectric grown by atomic-layer-deposition." *Appl. Phys. Lett.*, 83, pp. 180-182 (2003); Non-patent document 5: Ye, P. D. et al. "Depletion-mode InGaAs metal-oxide-semiconductor field-effect transistor with oxide gate dielectric grown by atomic-layer deposition." *Appl. Phys. Lett.*, 84, pp. 434-436 (2004); Rajagopalan, K., Abrokwah, J., Droopad, R., and Passlack, M. "Enhancement-mode GaAs n-channel MOSFET." *IEEE Electron Device Lett.*, 27, pp. 959-962 (2006); Oktyabrsky, S. et al. "High-k gate stack on GaAs and InGaAs using in situ passivation with amorphous silicon." *Mater. Sci. Eng. B*, 135, pp. 272-274 (2006); Xuan, Y., Wu, Y. Q., Lin, H. C., Shen, T., and Ye, P. D. "Submicrometer inversion n-type enhancement-mode InGaAs MOSFET with atomic-layer-deposited $Al_2O_3$ as gate dielectric." *IEEE Electron Device Lett.*, 28, pp. 935-938 (2007); Wu, Y. Q. et al. "Enhancement-mode InP n-channel metal-oxide-semiconductor field-effect transistors with atomic-layer-deposited $Al_2O_3$ dielectrics." *Appl. Phys. Lett.*, 91, 022108 (2007); Zhu, F. et al. "Depletion-mode GaAs metal-oxide-semiconductor field-effect transistor with amorphous silicon interface passivation layer $HfO_2$ gate oxide." *Appl. Phys. Lett.*, 91, 043507 (2007); Li, N. et al. "Properties of InAs metal-oxide-semiconductor structures with atomic-layer-deposited $Al_2O_3$ Dielectric." *Appl. Phys. Lett.*, 92, 143507 (2008); Lin, J. Q. et al. Inversion-mode self-aligned $In_{0.53}Ga_{0.47}As$ n-channel metal-oxide-semiconductor field-effect transistor with HfAlO gate dielectric and TaN metal gate." *IEEE Electron Device Lett.*, 29, pp. 977-990 (2008); and Chin, H. C. et al. "Silane-ammonia surface passivation for gallium arsenide surface-channel n-MOSFETs." *IEEE Electron Device Lett.*, 30, pp. 110-112 (2009).

SUMMARY OF THE INVENTION

According to one aspect of the present invention, a semiconductor substrate includes a substrate, an insulating layer, and a semiconductor layer. The insulating layer is over and in contact with the substrate. The insulating layer is made of at least one of an amorphous metal oxide and an amorphous metal nitride. The semiconductor layer is over and in contact with the insulating layer. The semiconductor layer is formed by crystal growth.

According to another aspect of the present invention, a field-effect transistor includes a source electrode and a drain electrode each electrically coupled to the semiconductor layer of the above-described semiconductor substrate.

According to another aspect of the present invention, an integrated circuit includes the above-described field-effect transistor.

According to the other aspect of the present invention, a method for fabricating a semiconductor substrate includes forming a semiconductor layer over a semiconductor-layer formed substrate by epitaxial crystal growth. An insulating layer is formed over the semiconductor layer by atomic-layer-deposition (ALD). A substrate is bonded to the insulating layer such that the substrate is over the insulating layer. The semiconductor-layer formed substrate is removed from the semiconductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 17A to 17F are schematic diagrams illustrating a method for fabricating the front-gate MISFET;

FIGS. 24A to 24C are schematic diagrams illustrating dehydration condensation between oxide layers in the process of fabricating the MISFET;

FIG. 25 is a photograph of a surface of an oxide layer under an AFM according to another embodiment;

FIG. 26 is an infrared (IR) image of oxide layers bonded to one another and subjected to a blade test;

FIGS. 36A to 36C are schematic diagrams illustrating a method (1) for fabricating the double-gate MISFET;

FIGS. 37A to 37C are schematic diagrams illustrating a method (2) for fabricating the double-gate MISFET;

DESCRIPTION OF THE EMBODIMENTS

Figure 1:
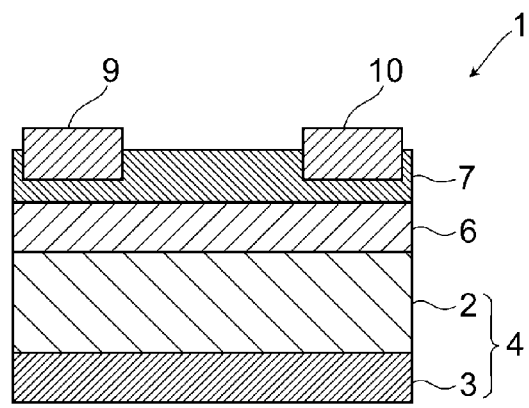
FIG. 1 is a schematic view of a cross-sectional structure of a MISFET according to an embodiment.

The embodiments will now be described with reference to the accompanying drawings, wherein like reference numerals designate corresponding or identical elements throughout the various drawings.

(1) CONFIGURATION OF MISFET

Referring to FIG. 1, reference numeral 1 indicates a metal-insulator-semiconductor field-effect transistor (MISFET), which is an embodiment of the field-effect transistor (semiconductor device) recited in the claims. The MISFET 1 includes a Si substrate 2 and an aluminum (Al) gate electrode 3. The Si substrate 2 has a prescribed thickness. The Al gate electrode 3 has a prescribed thickness and is disposed over one surface of the Si substrate 2. The Si substrate 2 and the Al gate electrode 3 form a gate 4. The MISFET 1 also includes an oxide layer 6 over the other surface of the Si substrate 2, and a group III-V compound semiconductor layer 7 over the oxide layer 6. The oxide layer 6 has a prescribed thickness and is made of $Al_2O_3$. The group III-V compound semiconductor layer 7 is made of a material that is not readily capable of crystal growth over the Si substrate 2. Examples include, but not limited to, indium gallium arsenide (InGaAs).

On one surface of the group III-V compound semiconductor layer 7, a source 9 and a drain 10 each of a gold-germanium (Au—Ge) alloy are disposed. The region in the group III-V compound semiconductor layer 7 defined between the source 9 and the drain 10 serves as a channel layer. Thus, in the MISFET 1, applying a gate voltage to the Al gate electrode 3 and applying a drain voltage between the source 9 and the drain 10 cause a flow of current from the source 9 to the drain 10.

In this embodiment, the source 9 and the drain 10 are each made of a Au—Ge alloy, and the MISFET 1 is of n-channel type. This, however, should not be construed in a limiting sense. The source 9 and the drain 10 each may be made of a gold-zinc (Au—Zn) alloy, and the MISFET 1 may be of p-channel type.

In this embodiment, the MISFET 1 employs a back-gate structure due to the ease at which the MISFET 1 is fabricated compared with a front-gate structure, and due to the ease at which the MISFET 1 is put into practice to prove its performance. Employing a back-gate structure as in this embodiment also ensures observation of a flat interfacial boundary between the oxide layer 6 and the group III-V compound semiconductor layer 7, as realized by ALD of the oxide layer 6, described later. Employing a back-gate structure also ensures observation of the superiority of the bonding described later.

(2) METHOD FOR FABRICATING MISFET

Figures 2A, 2B, 2C, 2D:
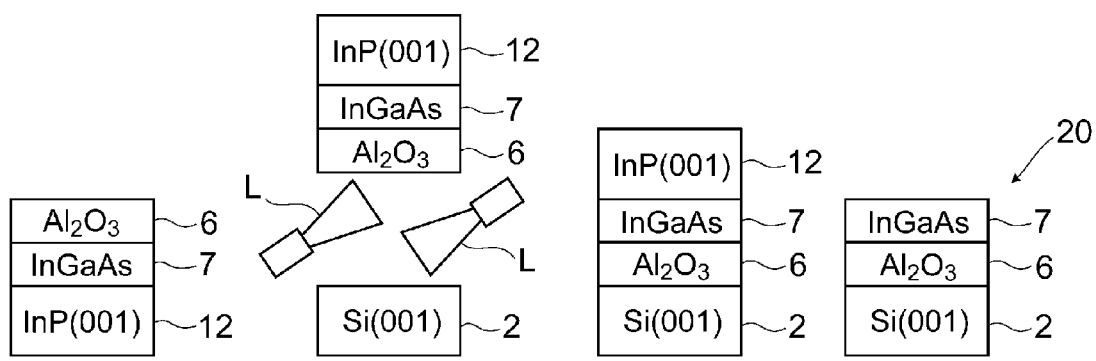
FIGS. 2A to 2D are schematic diagrams illustrating a method for fabricating the MISFET.

The MISFET 1 is fabricated by the following method. As shown in FIG. 2A, a group III-V compound semiconductor layer 7 is formed over a surface of an indium phosphide (InP) substrate 12 (having a diameter of, for example, approximately 2 inches) of InP by epitaxial growth of InGaAs over the surface of the InP substrate 12. The epitaxial growth is by metal-organic vapor phase epitaxy (MOVPE), which may also be referred to as metal-organic chemical vapor deposition (MOCVD). Specifically, the InP substrate 12 is placed into a reaction chamber (not shown), followed by a supply of reaction gas of trimethyl gallium (TMGa), reaction gas of trimethyl indium (TMIn), and reaction gas of tertiary butyl arsine (TBAs). The reaction gases TMGa and TMIn respectively are raw materials of the group III elements gallium (Ga) and indium (In). The reaction gas TBAs is a raw material of the group V element arsenide (As). This causes epitaxial growth of InGaAs over the surface of the InP substrate 12, which is now heated to a prescribed temperature. The crystal growth of InGaAs or other material may be by other methods including, but not limited to, molecular beam epitaxy (MBE) and liquid phase epitaxy (LPE).

Next, in this embodiment, an oxide layer ($Al_2O_3$) 6 of a prescribed thickness (for example, 6 nm to 44 nm) is formed over a surface of the group III-V compound semiconductor layer 7. This is by the use of an ALD equipment (not shown), which grows a thin film on a one atomic layer basis or on a one molecular layer basis. The ALD-formed oxide layer 6 of $Al_2O_3$ defines a preferable interface with the group III-V compound semiconductor layer 7, and forms a surface sufficiently flat to allow for bonding described later. When the group III-V compound semiconductor layer 7 intended as a channel layer has a small thickness (channel thickness), the interface state of the channel interface between the oxide layer 6 and the group III-V compound semiconductor layer 7 becomes influential. In this case, it is particularly required that the oxide layer 6 formed over the group III-V compound semiconductor layer 7 ensure satisfactory metal-oxide-semiconductor (MOS) interfaces (also referred to as metal-insulator-semiconductor (MIS) interfaces), with the group III-V compound semiconductor layer 7 in a satisfactory state. In this respect, forming the oxide layer 6 by ALD as in this embodiment ensures satisfactory MOS interfaces (MIS interfaces).

In this case, the ALD equipment forms the oxide layer 6 of $Al_2O_3$ over the surface of the group III-V compound semiconductor layer 7 using trimethyl aluminum (TMA, $Al(CH_3)_3$) and $H_2O$ as exemplary raw materials under exemplary conditions of 250° C. and a vacuum of 100 Pa with a TMA supply of $2 \times 10^{-6}$ mol. Next, as shown in FIG. 2B, a separate Si substrate 2 is prepared (having a diameter of for example, approximately 4 inches). The oxide layer 6 and the Si substrate 2, on their respective surfaces, are irradiated with argon (Ar) beams L of Ar gas in a vacuum. This brings the surfaces of the oxide layer 6 and the Si substrate 2 into activation. As used herein, the term activation refers to removing the surface layers, which are inhibitors of bonding, off the surfaces of the oxide layer 6 and the Si substrate 2 so as to expose atoms with valence bonds, thereby providing a state of ease of direct bonding among the valence bonds of the atoms on the surfaces. In this respect, the oxide layer 6 serves as a protection film of the group III-V compound semiconductor layer 7 to protect it from damage associated with the Ar beams L. Exemplary conditions for the Ar beam L irradiation include an accelerating voltage of approximately 1.5 keV, etching depths (degree removal by the Ar beams L) of approximately 4 nm on the Si substrate 2 side and equal to or less than approximately 1 nm on the oxide layer 6 side, and a vacuum of equal to or less than $5 \times 10^{-5}$ Pa.

Next, as shown in FIG. 2C, the oxide layer 6 and the Si substrate 2 are bonded to one another by surface activated bonding (SAB), which carries out the bonding in a vacuum at room-temperature. Specifically, the oxide layer 6 disposed over the group III-V compound semiconductor layer 7 over the InP substrate 12 is placed in opposing orientation to the Si substrate 2. Then in a vacuum, the oxide layer 6 disposed over the group III-V compound semiconductor layer 7 over the InP substrate 12 is brought into close contact with the Si substrate 2. The Si substrate 2 and the oxide layer 6 disposed over the group III-V compound semiconductor layer 7 over the InP substrate 12, which are now in close contact with one another, are pressed to one another so as to bond to one another at room-temperature. In this respect, the Si substrate 2 and the oxide layer 6 disposed over the group III-V compound semiconductor layer 7 over the InP substrate 12 have activated surfaces due to the Ar beams L. This further facilitates and enhances the room-temperature bonding. In order to minimize defects on the bonded portion and thus to improve quality, an appropriate load may be used at the time of bonding, which facilitates and enhances the room-temperature bonding. Thus, the group III-V compound semiconductor layer 7 is formed over the Si substrate 2 with the interposed oxide layer 6 disposed over the surface of the Si substrate 2 to intermediate between the Si substrate 2 and the group III-V compound semiconductor layer 7.

Next, as shown in FIG. 2D, the InP substrate 12 is selectively removed from the surface of the group III-V compound semiconductor layer 7. This is by the use of a solution of hydrogen chloride (HCl) or a solution of HCl and phosphoric acid ($H_3PO_4$) at a content ratio in the range of 1:4 to 1:1. Thus, a semiconductor substrate (substrate laminate) 20 is formed. Then as shown in FIG. 1, a source 9 and a drain 10 each of a Au—Ge alloy (88 weight %:12 weight %) are formed over the exposed group III-V compound semiconductor layer 7. As described above, while in this embodiment the MISFET 1 is of n-channel type and the source 9 and the drain 10 are each made of a Au—Ge alloy, the MISFET 1 may be of p-channel and the source 9 and the drain 10 each may be made of, for example, a Au—Zn alloy (95 weight %:5 weight %).

The source 9 and the drain 10 of the above-described metal material are formed by the following process. A resist is applied over the group III-V compound semiconductor layer 7 and exposed through a prescribed mask. This results in a resist pattern removing parts of the resist corresponding to the portion where the source is to be formed and the portion where the drain is to be formed. Then, a Au—Ge alloy (or a Au—Zn alloy) is formed at low temperature (equal to or lower than 24° C. (at room-temperature)) using a resistive heating vapor deposition apparatus. Then, the Au—Ge alloy (or Au—Zn alloy) is lifted off along with the resist excluding parts of the Au—Ge alloy (or Au—Zn alloy) corresponding to the portion where the source is to be formed and the portion where the drain is to be formed. Thus, the source 9 and the drain 10 are formed. The formation of the source 9 and the drain 10 may be by a usual etching back process or other various kinds of deposition methods.

Next, a resist is applied over the group III-V compound semiconductor layer 7, on which now the source 9 and the drain 10 are formed. The resist is exposed through a prescribed mask to form a resist pattern. Then, the group III-V compound semiconductor layer 7 is etched into a prescribed shape. This is by the use of a solution of $H_3PO_4$, $H_2O_2$, and $H_2O$ at a content ratio of 1:1:7 (other examples including, but not limited to, a solution of $H_3PO_4$:$H_2O_2$:$H_2O$ and a solution of $H_2SO_4$:$H_2O_2$:$H_2O$). Finally, an Al gate electrode 3 of Al is deposited onto the rear surface of the Si substrate 2 by resistance heating. Thus, the MISFET 1 shown in FIG. 1 is fabricated.

(3) PERFORMANCE AND ADVANTAGEOUS EFFECTS

In the above configuration of the MISFET 1, InGaAs is epitaxially grown over the surface of the InP substrate 12 to form the group III-V compound semiconductor layer 7. Over the surface of the group III-V compound semiconductor layer 7, the oxide layer 6 is formed by ALD, which grows a thin film on a one atomic layer basis or on a one molecular layer basis. Forming the oxide layer 6 by ALD ensures a flat surface and facilitates the bonding of the substrates in a subsequent step.

Additionally, the bonding surface of the Si substrate 2 and the bonding surface of the oxide layer 6 disposed over the group III-V compound semiconductor layer 7 over the InP substrate 12 are activated by the Ar beams L. This further facilitates the room-temperature bonding in a vacuum. In the method for fabricating the MISFET 1 according to this embodiment, the oxide layer 6 protects the surface of the group III-V compound semiconductor layer 7 from the Ar beams L so as to eliminate or minimize damage to the crystalline structure of the group III-V compound semiconductor layer 7 and to eliminate or minimize degradation of characteristics of the group III-V compound semiconductor layer 7.

Additionally, at the time of bonding the substrates, no particular heat treatment is necessary and a firm bonding at room-temperature is ensured between the Si substrate 2 and the oxide layer 6 disposed over the group III-V compound semiconductor layer 7 over the InP substrate 12. In accordance with the elimination of heat treatment, the fabrication process is simplified and the fabrication itself is facilitated. In particular, since the group III-V compound semiconductor layer 7 is small in heat resistant, the elimination of heat treatment eliminates or minimizes degradation of the characteristics of the group III-V compound semiconductor layer 7, and ensures that the group III-V compound semiconductor layer 7 is formed over the Si substrate 2 in an appropriate state. Also at the time of bonding the substrates, the oxide layer 6 formed over the group III-V compound semiconductor layer 7 is pressed against the Si substrate 2 and firmly bonded to the Si substrate 2. This eliminates or minimizes damage to the group III-V compound semiconductor layer 7 at the time of bonding the substrates.

Then, in the method for fabricating the MISFET 1, the InP substrate 12 alone is removed from the group III-V compound semiconductor layer 7 by selective etching with a prescribed solution. The removal of the InP substrate 12 alone from the group III-V compound semiconductor layer 7 by the selective etching results in the group III-V compound semiconductor layer 7 formed over the Si substrate 2.

In the MISFET 1, the amorphous oxide layer 6 intermediates between the group III-V compound semiconductor layer 7 and the Si substrate 2. This eliminates or minimizes degradation of heat resistance caused by a difference in coefficients of thermal expansion between the group III-V compound semiconductor layer 7 and the Si substrate 2. Additionally, the oxide layer 6 according to this embodiment is made of $Al_2O_3$.

This improves the bonding strength of the oxide layer 6 against the Si substrate 2 compared with an oxide layer of $SiO_2$.

Also in the MISFET 1, the flat oxide layer 6 formed over the group III-V compound semiconductor layer 7 is flat due to ALD and forms a satisfactory interface with the group III-V compound semiconductor layer 7. At the same time, the oxide layer 6 is bonded by SAB to the Si substrate 2 without degradation of the characteristics of the group III-V compound semiconductor layer 7. This ensures that both the group III-V compound semiconductor layer 7 and the oxide layer 6 are kept equal to or less than 100 nm in thickness, resulting in a reduction in the overall thickness compared with the conventional art. Reducing the thickness of the oxide layer 6 in the MISFET 1 ensures satisfactory transistor characteristics using a low gate voltage even with the back gate structure with the Si substrate 2 and the Al gate electrode 3 forming the gate 4. This, as a result, saves power consumption.

The source 9 and the drain 10 of the field-effect transistor according to this embodiment are not subjected to ion implantation in their formation process. Instead, the source 9 and the drain 10 are simply made of a metal material. This makes their formation feasible at low temperatures and ensures low resistance. This more securely minimizes damage caused by ion implantation and activation anneal process after the ion implantation.

In this embodiment, the oxide layer 6 is formed over the surface of the group III-V compound semiconductor layer 7. This ensures a substantial distance between the surface of the channel layer, which is formed as the group III-V compound semiconductor layer 7, and the bonding interface between the oxide layer 6 and the Si substrate 2. This, as a result, further reduces damage to the channel layer at the time of bonding.

In the above-described configuration, the oxide layer 6 over the group III-V compound semiconductor layer 7 disposed over the InP substrate 12 has a flat surface due to ALD. This, in turn, facilitates the fabrication of MISFET 1. Specifically, simply bonding the oxide layer 6 and the Si substrate 2 to one another at room-temperature, instead of by heat treatment, ensures a firm bonding between the oxide layer 6 and the Si substrate 2. This ensures that the group III-V compound semiconductor layer 7 formed over the InP substrate 12, which is one substrate, is formed over the Si substrate 2, which is the other substrate. This eliminates or minimizes damage to the crystalline structure of the group III-V compound semiconductor layer 7, thereby keeping the crystalline structure in high quality.

(4) EXAMPLES

Next, the MISFET 1 was fabricated in accordance with the above-described method and subjected to various kinds of estimation.

(4-1) Semiconductor Substrate

First, an InGaAs film of $In_{0.53}Ga_{0.47}As$ was formed over the surface of the InP substrate 12 to form the group III-V compound semiconductor layer 7. Next, the obtained combination was immersed in ammonia water (29%) for 1 minute at room-temperature in order to remove superficial oxides, and then cleaned in de-ionized water (DIW) for 1 minute and dried with nitrogen gas sprayed through a particle filter. When the surface treatment was by the use of an ammonium sulfide solution (0.6% to 1.0% $(NH_4)_2S_x$), the obtained combination was immersed in the ammonium sulfide solution for 10 minutes at room-temperature in order to sulfurate the surface, followed by cleaning in pure water and drying, similarly to the surface treatment with ammonia water. Next, an ALD equipment ran a cycle of a supply of $2 \times 10^{-6}$ mol of raw material TMA for 0.1 seconds under the conditions of 250° C. and a vacuum of 100 Pa, 3 seconds of vacuum evacuation, 2 seconds of $H_2O$ supply, and 7 seconds of vacuum evacuation. At a growth rate of 0.11 nm per cycle, the oxide layer 6 of $Al_2O_3$ was formed over the group III-V compound semiconductor layer 7.

Next, the Si substrate 2 was prepared as a separate entity from the InP substrate 12. The Si substrate 2 and the oxide layer 6 were irradiated with Ar beams. The conditions for the Ar beam irradiation were an accelerating voltage of approximately 1.5 key, etching depths of approximately 4 nm on the Si substrate 2 side and approximately equal to or less than 1 nm on the oxide layer 6 side, and a vacuum of equal to or less than $5 \times 10^{-5}$ Pa.

Figure 3A:
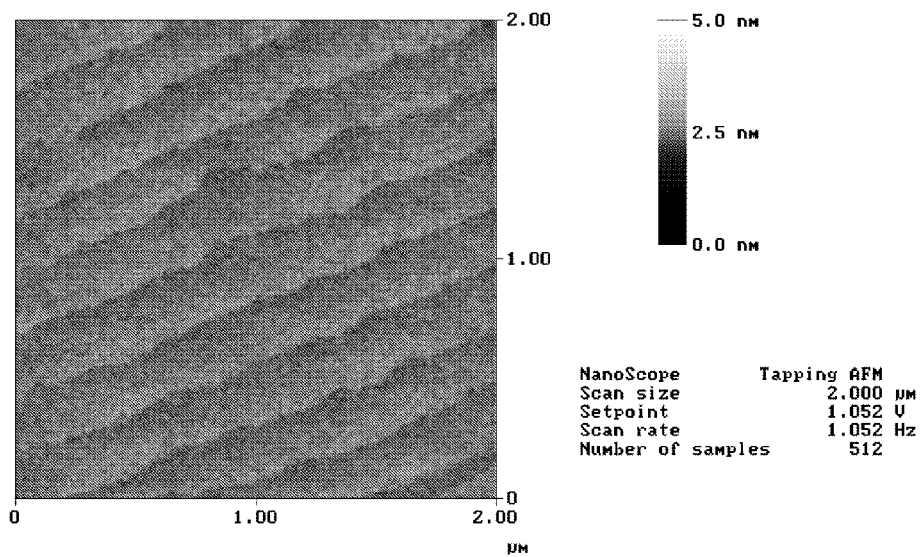
FIGS. 3A and 3B are photographs of a surface of an oxide layer under an atomic force microscope (AFM)
Figure 3B:
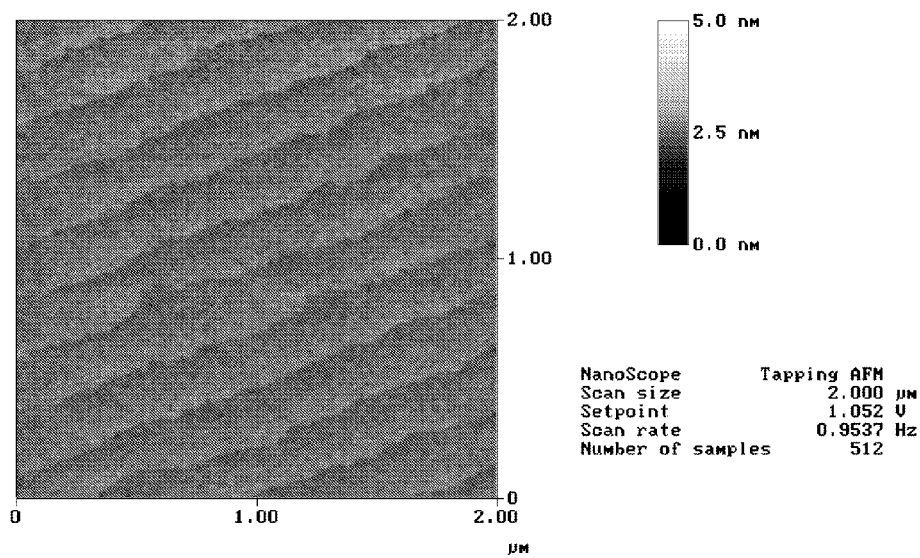

The oxide layer 6 thus fabricated over the group III-V compound semiconductor layer 7 over the InP substrate 12 was observed under an AFM at varied scanning rates. Results are shown in FIGS. 3A and 3B. FIGS. 3A and 3B show that the oxide layer 6 has, on its bonding surface, protrusions and depressions (micro-roughness) that are as fine as approximately 0.1 nm to 0.2 nm, proving a flatness sufficient for bonding of the substrates.

Figure 4:
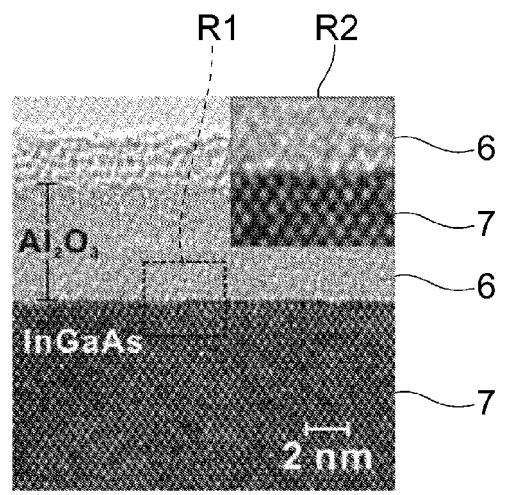
FIG. 4 is a transmission electron microscopy (TEM) image of the interface between a group III-V compound semiconductor layer and the oxide layer.

The interface between the oxide layer 6 and the group III-V compound semiconductor layer 7 was imaged by TEM. Results are shown in FIG. 4. In FIG. 4, the area R2 corresponds to the area R1 enlarged. FIG. 4 shows that the interface between the oxide layer 6 and the group III-V compound semiconductor layer 7 is flat and acute (clear).

Figure 5A:
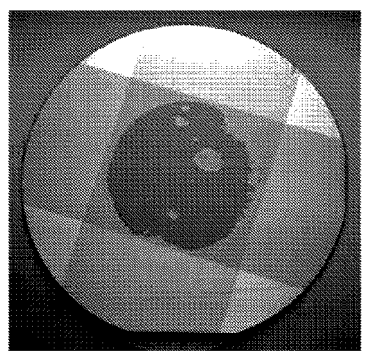
FIGS. 5A and 5B are photographs showing results of a bonding strength test using dicing with respect to an oxide layer and Si substrate laminate.
Figure 5B:
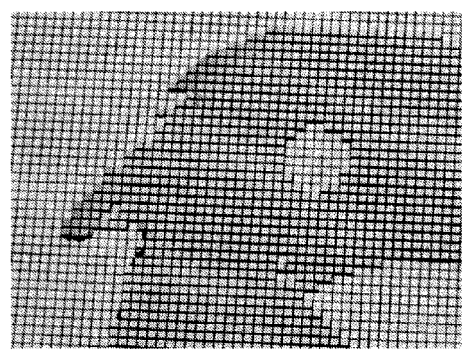

Next, the oxide layer 6 over the InP substrate 12 and the Si substrate 2 were brought into close contact with one another in a vacuum at room-temperature, so as to laminate and bond the oxide layer 6 over the InP substrate 12 to the Si substrate 2. The oxide layer 6 and Si substrate 2 laminate was subjected to a bonding strength test of dicing to estimate the bonding strength of the laminate. Results of the bonding strength test of dicing are shown in FIGS. 5A and 5B. FIG. 5B is an enlarged photograph of the photograph shown in FIG. 5A. FIGS. 5A and 5B show that the bonding at room-temperature, instead of by heat treatment, ensures a sufficient bonding strength of the interface between the oxide layer 6 and the Si substrate 2 to withstand the dicing.

Figure 6A:
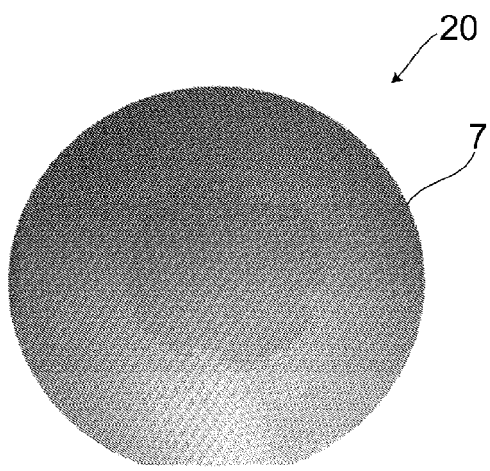
FIG. 6A is a photograph of a surface of the group III-V compound semiconductor layer.
Figure 6B:
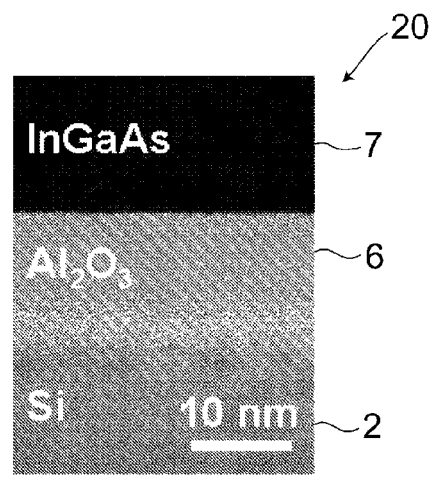
FIG. 6B is a TEM image of the respective interfaces of the Si substrate, the oxide layer, and the group III-V compound semiconductor layer.

Next, the InP substrate 12 was reduced in thickness using a HCl solution. Then, the reduced InP substrate 12 was selectively removed using a solution of HCl and $H_3PO_4$ at a content ratio of 1:4 or using a diluted HCl solution. FIGS. 6A and 6B show a semiconductor substrate 20 that includes the group III-V compound semiconductor layer 7 of InGaAs film formed over the Si substrate 2 across the oxide layer 6 in the above-described manner. FIG. 6A shows that the group III-V compound semiconductor layer 7 has a flat and specular surface. The TEM image of FIG. 6B shows that the interface between the oxide layer 6 and the Si substrate 2 is flat and acute (clear). The TEM image also shows that the damage by the irradiation of the Ar beams is blocked by the oxide layer 6 and does not reach the group III-V compound semiconductor layer 7. The TEM image further shows that the bonding intermediated by the oxide layer 6 eliminates damage to the group III-V compound semiconductor layer 7 at the time of bonding of the substrates.

Thus, the oxide layer 6 was formed by ALD, and the InP substrate 12 and the Si substrate 2 were bonded to one another at the oxide layer 6. Then the InP substrate 12 was removed so that the InGaAs film was formed over the Si substrate 2. The above-described results prove that the InGaAs film thus formed satisfactorily remains its superior crystallinity and structural characteristics.

(4-2) MISFET

Next, a resist was applied over the InGaAs film (group III-V compound semiconductor layer 7) of the semiconductor substrate 20. The resist was exposed through a prescribed mask to form a resist pattern removing parts of the resist corresponding to the portion where the source was to be formed and the portion where the drain was to be formed. Then, a Au—Ge alloy (or a Au—Zn alloy) was formed at low temperature (equal to or lower than 24° C.) using a resistive heating vapor deposition apparatus. Then, the Au—Ge alloy (or Au—Zn alloy) was lifted off along with the resist excluding parts of the Au—Ge alloy (or Au—Zn alloy) corresponding to the portion where the source was to be formed and the portion where the drain was to be formed. Thus, the source 9 and the drain 10 were formed.

Next, a resist was applied over the InGaAs film, on which now the source 9 and the drain 10 were formed. The resist was exposed through a prescribed mask to form a resist pattern. Then, the InGaAs film was etched using a solution of $H_3PO_4$, $H_2O_2$, and $H_2O$ at a content ratio of 1:1:7. Finally, an Al gate electrode 3 of Al was deposited onto the rear surface of the Si substrate 2 by resistance heating. Thus, the MISFET 1 was fabricated. The thickness $d_{InGaAs}$ of the InGaAs film with the oxide layer 6 as a buried layer was 100 nm. The channel length $L_G$ of the InGaAs film between the source 9 and the drain 10 was 500 µm. The width W of the channel layer was 100 µm. The thickness $d_{Al2O3}$ of the oxide layer 6 was 22 nm.

Figure 7:
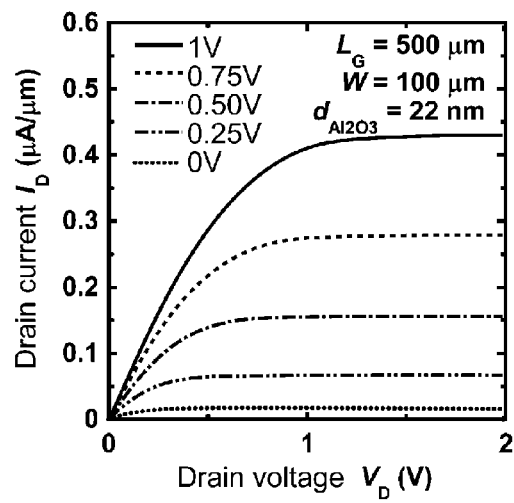
FIG. 7 is a graph illustrating a relationship between drain voltage and drain current of the MISFET.

The MISFET 1 thus fabricated was examined to ascertain how the drain voltage and the drain current were related to one another at room-temperature. Results are shown in FIG. 7. The results show fair drain current-voltage characteristics, with a satisfactory saturation characteristic and a satisfactory pinch-off characteristic.

Figure 8:
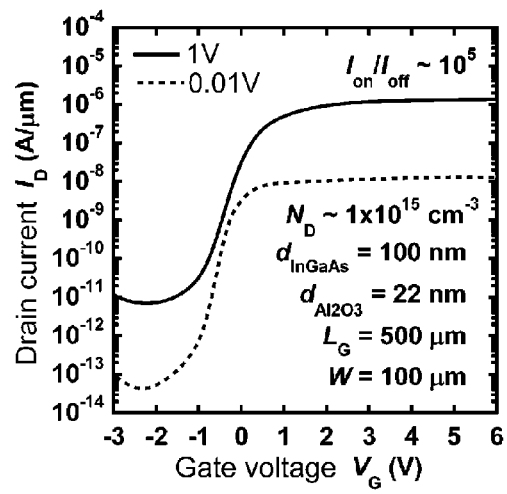
FIG. 8 is a graph illustrating a relationship between gate voltage and drain current of the MISFET.

FIG. 8 shows a relationship between gate voltage and drain current of MISFET 1 at room-temperature, proving satisfactory transistor characteristics. Here, the InGaAs film had a carrier density $N_D$ of $1 \times 10^{15}$ cm$^{-3}$ and an In composition of 0.53, which ensures lattice matching with the InP substrate 12. As shown in FIG. 8, the current on/off ratio $I_{on}/I_{off}$ is $10^5$, which is a ratio between "ON" and "OFF" of operation, the subthreshold slope S is 170 mV/decade, and the interface state density $D_{it}$ is $1 \times 10^{12}$ cm$^{-2}$ eV$^{-1}$. The interface state density $D_{it}$ can be obtained from the current on/off ratio $I_{on}/I_{off}$ and the subthreshold slope S. These results prove that the MISFET 1 has satisfactory interface quality from a viewpoint of a MISFET using a group III-V compound.

Figure 9:
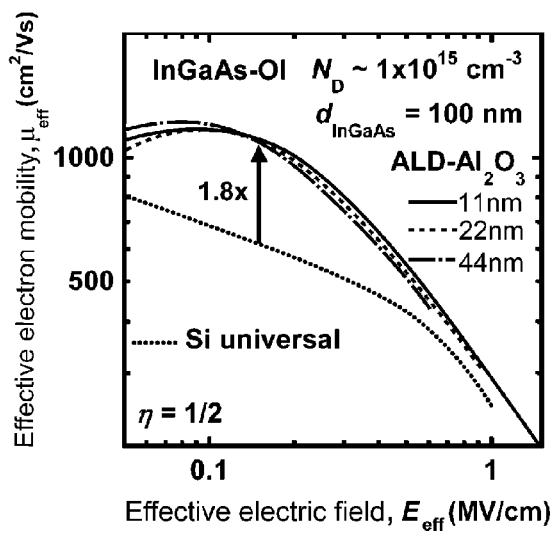
FIG. 9 is a graph illustrating: a relationship between effective electron mobility and effective electric field of the MISFET according to the embodiment; a relationship between effective electron mobility and effective electric field of a Si nMOSFET; and film thickness dependency.
Figure 10:
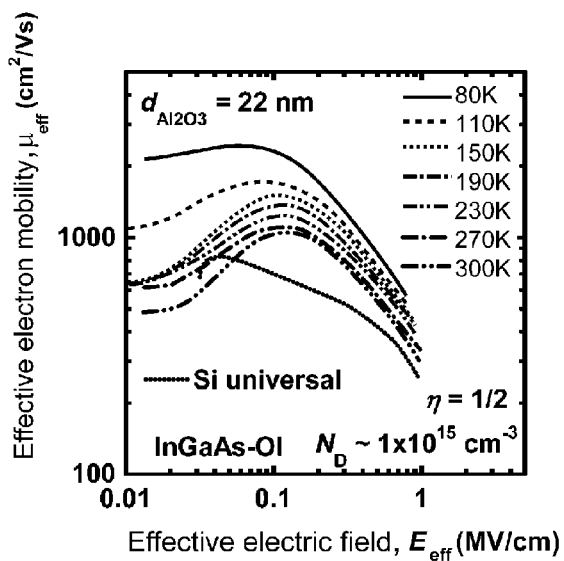
FIG. 10 is a graph illustrating: a relationship between effective electron mobility and effective electric field of the MISFET according to the embodiment; a relationship between effective electron mobility and effective electric field of the Si nMOSFET; and temperature dependency.

FIG. 9 shows a relationship between effective electron mobility and effective electric field of the MISFET 1 at room-temperature, and film thickness dependency. The thickness of the oxide layer 6 was varied, 11 nm, 22 nm, and 44 nm. As shown in FIG. 9, the effective electron mobility is high regardless of the thickness of the oxide layer 6. Even with an Ar beam of comparatively high intensity, using the protection film of $Al_2O_3$ layer ensures a reduction in thickness of the buried oxide layer to approximately 10 nm without damaging the III-V channel layer. FIG. 10 shows a relationship between effective electron mobility and effective electric field of the MISFET 1 at room-temperature, and temperature dependency. In FIGS. 9 and 10, "InGaAs-OI" refers to the MISFET 1 according to this embodiment. "Si universal" refers to a Si nMOSFET, with an n-channel metal-oxide-semiconductor field-effect transistor (MOSFET) formed on the Si substrate. The results show that the MISFET 1 has a higher effective electron mobility than the effective electron mobility of the Si nMOSFET. The results also show that the maximum mobility is 1200 cm$^2$V$^{-1}$s$^{-1}$, and that at an effective electric field $E_{eff}$ of 0.16 MV/cm at room-temperature, the effective electron mobility of the MISFET 1 according to this embodiment is approximately 1.8 times higher than the effective electron mobility of the Si nMOSFET. The results further show that satisfactory III-V MIS interfaces are formed due to ALD, ensuring a higher mobility than the mobility of the Si nMOSFET even on the high electric field region.

Figure 11:
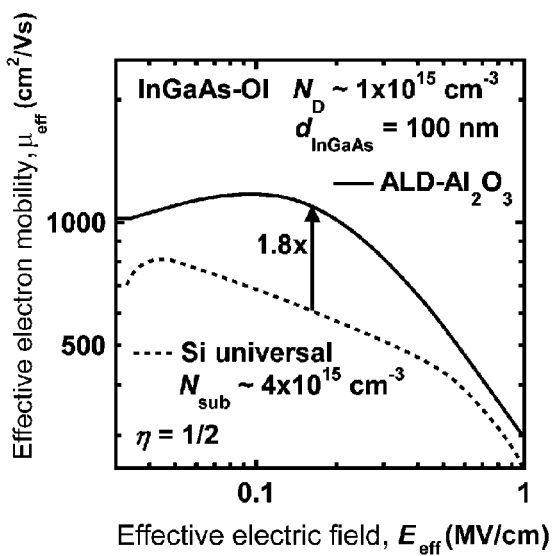
FIG. 11 is a graph illustrating: a relationship between effective electron mobility and effective electric field of the MISFET at room-temperature according to the embodiment; and a relationship between effective electron mobility and effective electric field of the Si nMOSFET at room-temperature.

FIG. 11 shows a relationship between effective electron mobility and effective electric field of the MISFET 1 (indicated "ALD-$Al_2O_3$" in the drawing) at room-temperature according to this embodiment, and a relationship between effective electron mobility and effective electric field of the Si nMOSFET (indicated "Si universal" in FIG. 11) at room-temperature. As shown in FIG. 11, "ALD-$Al_2O_3$" refers to an n-channel MISFET 1 including an InGaAs film (group III-V compound semiconductor layer 7) of 100 nm thick with an oxide layer 6 of $Al_2O_3$ as a buried oxide (BOX) layer. FIG. 11 proves that the MISFET 1 has superior characteristics to those of the Si nMOSFET. FIG. 11 also proves that the MISFET 1 exhibits superior performance to that of the Si nMOSFET even in the high electric field region.

Thus, a high performance CMOS semiconductor device is ensured having an nMOSFET with an InGaAs channel of high electron mobility and a pMOSFET with a Ge channel of high hole mobility simultaneously formed over Si. This ensures fabrication of a superior device to a Si CMOS transistor. Additionally, another crystal regrowth is possible over a bonded layer of high crystallinity, resulting in integation of another field-effect transistor.

(5) OTHER EMBODIMENTS

In the above-described embodiment, the respective surfaces of the oxide layer 6 and the Si substrate 2 are irradiated with Ar beams for activation, followed by bonding of the substrates. This, however, should not be construed in a limiting sense. It is also possible to irradiate with Ar beams to only one of the surface of the oxide layer 6 and the surface of the Si substrate 2 for activation, followed by bonding of the substrates. Alternatively, the bonding of the substrates may be without irradiation of Ar beams to the oxide layer 6 or the Si substrate 2.

While in the above-described embodiment Ar beams are used, this should not be construed in a limiting sense. Any other kinds of beams are possible insofar as the surfaces of the oxide layer 6 and the Si substrate 2 are activated.

In the above-described embodiment, the oxide layer 6 made of the amorphous metal oxide $Al_2O_3$ is used as the insulating layer partially serving as a gate insulating layer. This, however, should not be construed in a limiting sense. Other examples include, but not limited to, $Al_2O_3$, $SiO_2$, AlN, SiN, SiON, $Ta_2O_5$, $ZrO_2$, $HfO_2$, $La_2O_3$, $Y_2O_3$ and a mixture of any of the foregoing. It is also possible to use a laminate of a plurality of the foregoing different insulating layers. An oxide layer of $HfO_2$ may be formed using a raw material such as $Hf[N(CH_3)_2]_4$, $Hf[N(C_2H_5)]_4$, TEMAHF ($Hf[N(CH_3)(C_2H_5)]_4$) and $HfCl_4$. An oxide layer of $SiO_2$ may be formed using a raw material such as $SiH[N(CH_3)_2]_3$.

It is particularly noted that although $Al_2O_3$, $Ta_2O_5$, $ZrO_2$, $HfO_2$ and AlN have not conventionally been used as insulating layers for semiconductor substrates, the method for fabrication according to the above-described embodiment ensures use of these materials as insulating layers for semiconductor substrates. With an insulating layer of an amorphous metal oxide such as $Al_2O_3$, $Ta_2O_5$, $ZrO_2$, $HfO_2$ or of an amorphous metal nitride such as AlN, the resulting semiconductor substrate has a higher effective electron mobility than the conventional effective electron mobility. Using the semiconductor substrate for a field-effect transistor and for an integrated circuit of various kinds of field-effect transistors makes the field-effect transistor and the integrated circuit high in effective electron mobility compared with the conventional effective electron mobility.

While in the above-described embodiment the group III-V compound semiconductor layer of InGaAs is used as the semiconductor layer, this should not be construed in a limiting sense. The group III-V compound semiconductor layer may be made of any other various kinds of group III-V compound semiconductor such as InP and GaAs. Use of a group III-V compound semiconductor layer as a channel layer involves selection of an etching material depending on which group III-V compound semiconductor layer to use. The channel layer may be a laminate of a plurality of group III-V compound semiconductor layers. It is also possible to use a laminate of a plurality of alternate semiconductor layers, as channel layers, and oxide layers.

While in the above-described embodiment the Si substrate 2 of Si is used as the substrate to be in contact with the insulating layer, this should not be construed in a limiting sense. The substrate may be made of any other various kinds of material such as glass, plastic, and ceramic. It is also possible to use a multi-layer structure of a plurality of layers each made of a different material.

(5-1) Ammonium Sulfide Solution Treatment

Figure 12:
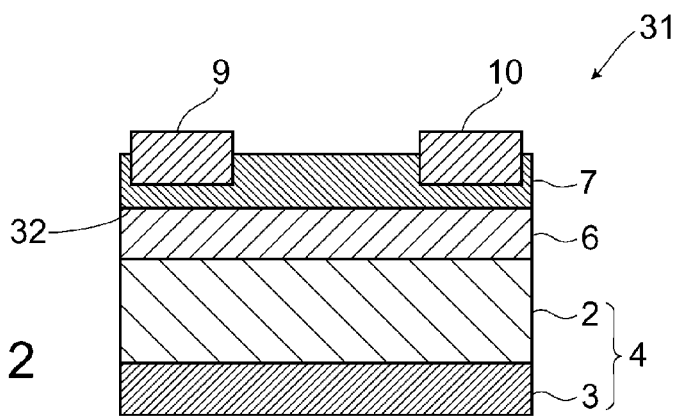
FIG. 12 is a schematic view of a cross-sectional structure (1) of MISFET according to another embodiment.
Figure 13C:
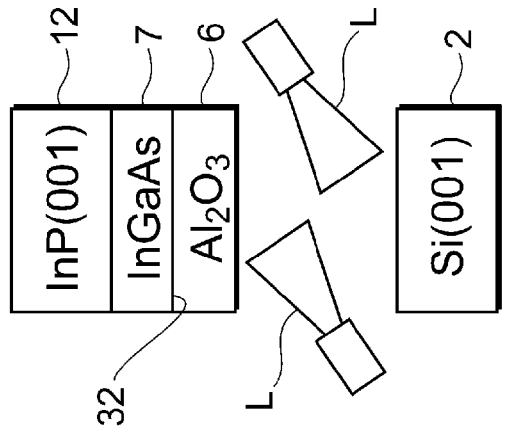
FIGS. 13A to 13E are schematic diagrams illustrating a method (1) for fabricating the MISFET according to another embodiment.

In FIG. 12, corresponding elements to those in FIG. 1 are designated by the same reference numerals. Referring to FIG. 12, reference numeral 31 indicates a MISFET according to another embodiment. The MISFET 31 is different from the MISFET 1 in that a surface of the group III-V compound semiconductor layer 7 is terminated with sulfur (S) atoms in an ammonium sulfide solution so as to form a S treated surface 32 over the surface of the group III-V compound semiconductor layer 7. Specifically, as shown in FIG. 13A, InGaAs is epitaxially grown over a surface of the InP substrate 12 to form the group III-V compound semiconductor layer 7. Then, the surface of the group III-V compound semiconductor layer 7 is immersed in an ammonium sulfide solution, thus forming the S treated surface 32.

Figure 13B:
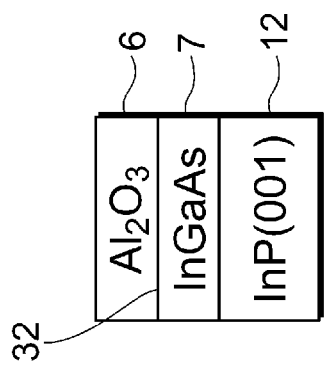

In FIG. 13B, corresponding elements to those in FIG. 2A are designated by the same reference numerals. Referring to FIG. 13B, the oxide layer ($Al_2O_3$) 6 of a prescribed thickness is formed using an ALD equipment (not shown) over the S treated surface 32, which is formed over the surface of the group III-V compound semiconductor layer 7. In FIG. 13C, corresponding elements to those in FIG. 2B are designated by the same reference numerals. Referring to FIG. 13C, the Si substrate 2 is prepared, and the oxide layer 6 and the Si substrate 2, on their respective surfaces, are irradiated with Ar beams L of Ar gas in a vacuum. This brings the surfaces of the oxide layer 6 and the Si substrate 2 into activation.

Figure 13E:
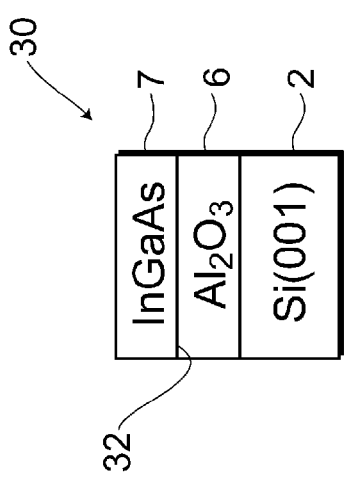
Figure 13A:
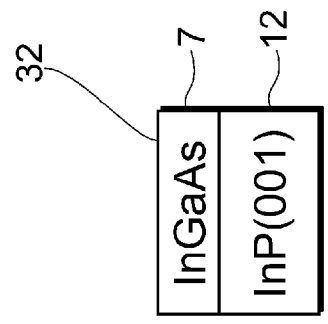
Figure 13D:
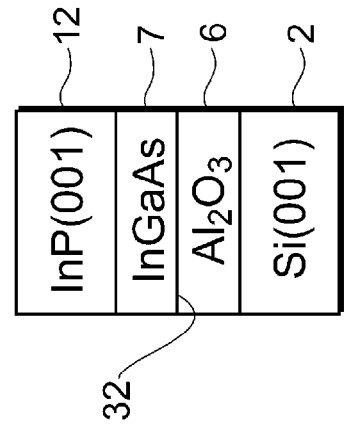

In FIG. 13D, corresponding elements to those in FIG. 2C are designated by the same reference numerals. Referring to FIG. 13D, the oxide layer 6 and the Si substrate 2 are bonded to one another by SAB. In FIG. 13E, corresponding elements to those in FIG. 2D are designated by the same reference numerals. Referring to FIG. 13E, the InP substrate 12 is selectively removed from the surface of the group III-V compound semiconductor layer 7. This is by the use of a solution of HCl or a solution of HCl and $H_3PO_4$ at a content ratio in the range of 1:4 to 1:1. Thus, a semiconductor substrate 30 is formed. Then, the source 9 and the drain 10 are formed over the exposed group III-V compound semiconductor layer 7. At the same time, the Al gate electrode 3 of Al is deposited onto the rear surface of the Si substrate 2 by resistance heating. Thus, the MISFET 1 as shown in FIG. 12 is fabricated.

Figure 14:
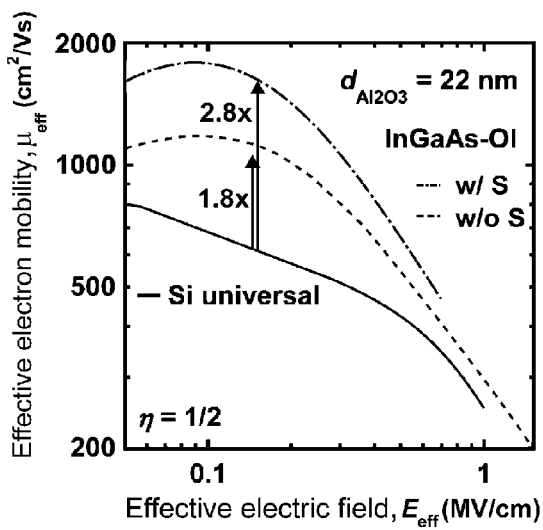
FIG. 14 is a graph illustrating a relationship (1) between effective electron mobility and effective electric field of the MISFET according to another embodiment.

Next, the MISFET 31 was examined to ascertain how the effective electron mobility and the effective electric field were related to one another at room-temperature. Results are shown in FIG. 14. The conditions under which the MISFET 31 was fabricated were the same as the conditions for the MISFET 1 shown in FIG. 9 except for the thickness of the oxide layer 6, which was 22 nm, and the addition of the S treated surface 32. In FIG. 14, "w/S" indicates the MISFET 31 with the S treated surface 32, while "w/o S" indicates the MISFET 1 without the S treated surface 32. "Si universal" indicates the Si nMOSFET.

The results of FIG. 14 show that at an effective electric field $E_{eff}$ of 0.16 MV/cm at room-temperature, the effective electron mobility of the MISFET 31 is approximately 2.8 times higher than the effective electron mobility of the Si nMOSFET. The results also show that the MISFET 31 has an improved effective electron mobility over the effective electron mobility of the MISFET 1.

Figure 15:
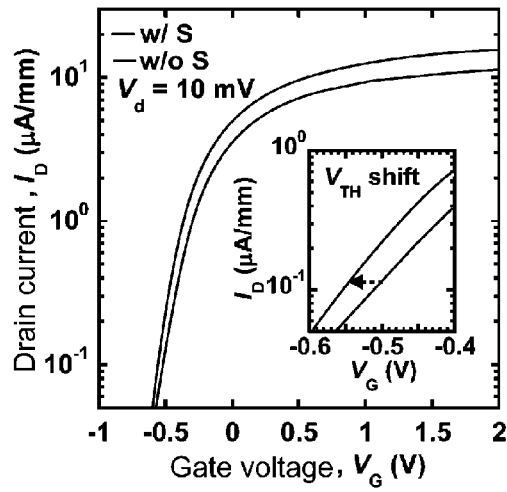
FIG. 15 is a graph illustrating a relationship between gate voltage and drain current of the MISFET according to another embodiment.

Next, the MISFET 31 was examined to ascertain how the gate voltage and the drain current were related to one another at room-temperature. Results are shown in FIG. 15. The results of FIG. 15 show that the MISFET 31 has satisfactory transistor characteristics, and that formation of the S treated surface 32 ensures a shift of threshold in an ideal threshold direction expected from a band profile. The results of FIGS. 14 and 15 reveal that the S treated surface 32 causes an effect of reducing surface electric charge, resulting in improved effective electron mobility.

(5-2) Front-Gate MISFET

In the above-described embodiments, the back-gate MISFET 1 is fabricated using the semiconductor substrate 20 shown FIG. 2D. This, however, should not be construed in a limiting sense. It is also possible to fabricate a front-gate MISFET using the semiconductor substrate 20 or 75. This also applies to the embodiments that follow. A front-gate MISFET will be described here.

Figure 16:
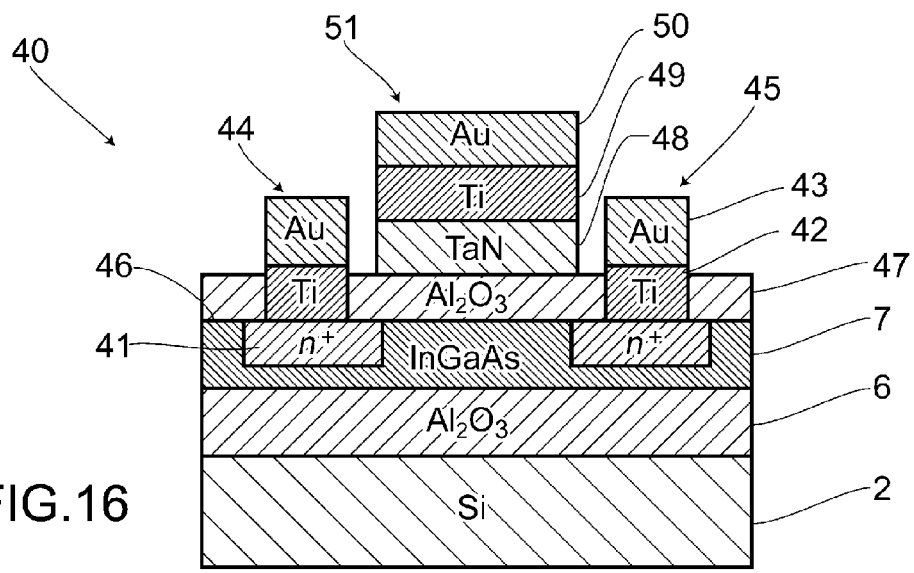
FIG. 16 is a schematic view of a cross-sectional structure of a front-gate MISFET.

In FIG. 16, corresponding elements to those in FIG. 1 are designated by the same reference numerals. Referring to FIG. 16, reference numeral 40 indicates a front-gate MISFET according to another embodiment. In the group III-V compound semiconductor layer 7, doped layers 41 are disposed. The doped layers 41 are doped with Si, S, or Se, for example. Over each doped layer 41, a titanium (Ti) layer 42 and a gold (Au) layer 43 are disposed, resulting in a source 44 and a drain 45. The region in the group III-V compound semiconductor layer 7 defined between the source 44 and the drain 45 serves as a channel layer. In this embodiment, a S treated surface 46 is disposed over a surface of the group III-V compound semiconductor layer 7. The S treated surface 46 is obtained by terminating the surface of the group III-V compound semiconductor layer 7 with S atoms in an ammonium sulfide solution.

Over the S treated surface 46, which is over the surface of the group III-V compound semiconductor layer 7, an oxide layer 47 of $Al_2O_3$ is disposed to serve as a second insulating layer. Over the channel layer region defined between the source 44 and the drain 45, a gate 51 is disposed having a tantalum nitride (TaN) layer 48, a Ti layer 49, and a Au layer 50. Thus, in the MISFET 40, applying a gate voltage to the gate 51 and applying a drain voltage between the source 44 and the drain 45 cause a flow of current from the source 44 to the drain 45.

In practice, the MISFET 40 may be fabricated in the following order. The semiconductor substrate 20 is formed in the above-described manner by referring to FIGS. 2A to 2D. Then, as shown in FIG. 17A, an oxide layer 55 of $Al_2O_3$ is farmed over the surface of the group III-V compound semiconductor layer 7 of the semiconductor substrate 20. A resist 56 is then applied over a surface of the oxide layer 55. In this respect, it is also possible to use the semiconductor substrate 30, which is fabricated by the process shown in FIGS. 13A to 13E, instead of the semiconductor substrate 20, which is fabricated by the process shown in FIGS. 2A to 2D.

Next, the resist 56 is exposed through a prescribed mask to form a resist pattern removing parts of the resist corresponding to the portion where the source is to be formed and the portion where the drain is to be formed. Then, as shown in FIG. 17B, the portion where the source is to be formed and the portion where the drain is to be formed on the oxide layer 55 are treated with ion implantation to introduce a high concentration of carrier impurities of Si, S, or Se (in this case, Si). Thus, source/drain formation portions 58 are formed in the group III-V compound semiconductor layer 7.

Next, as shown in FIG. 17C, the resist 56 is removed, and the doped layers 41 are formed by annealing for 10 seconds at 600° C. Then, as shown in FIG. 17D, the oxide layer 55, which is now damaged by the ion implantation, is removed. Next, the surfaces of the group III-V compound semiconductor layer 7 and the doped layers 41 are immersed in an ammonium sulfide solution so as to terminate the surfaces with S atoms. Thus, the S treated surface 46 is formed over the surfaces. Next, the oxide layer 47 of $Al_2O_3$ is formed over a surface of the S treated surface 46. Then, a TaN layer 48 is formed over the surface of the oxide layer 47. Additionally, a resist 60 is applied over a surface of the TaN layer 48.

Next, the resist 60 is exposed through a prescribed mask to form a resist pattern removing parts of the resist 60 corresponding to the portion of one doped layer 41 where the source is to be formed and the portion of the other doped layer 41 where the drain is to be formed. Then, as shown in FIG. 17E, parts of the TaN layer 48 and the oxide layer 47 corresponding to the removed parts of the resist are removed by etching. Then as shown in FIG. 17F, the resist 60 is removed.

Finally, in order to form the source and the drain, a patterned resist is formed over a surface of the TaN layer 48. Over the resist, the Ti layer 49 and the Au layer 50 are formed to serve as the source, the drain, and the gate. Next, the resist is lifted off. Then, the exposed TaN layer 48 excluding the part corresponding to the gate is removed by etching. Thus, the MISFET 40 shown in FIG. 16 is fabricated.

Figure 18:
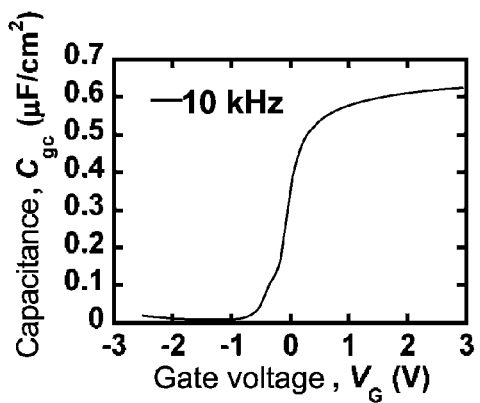
FIG. 18 is a graph illustrating a relationship between gate voltage and capacitance of the front-gate MISFET.
Figure 19:
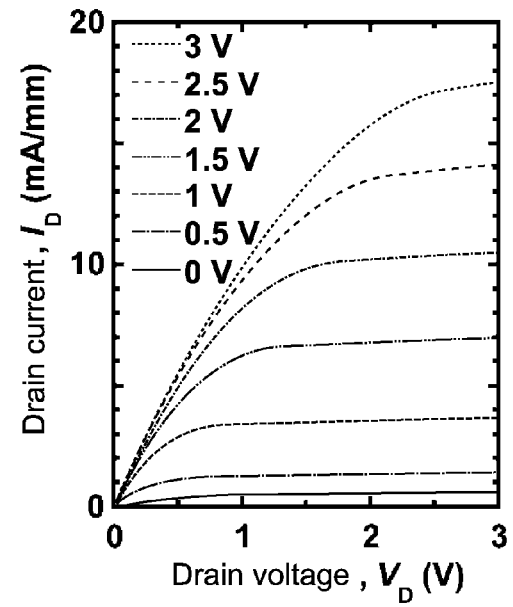
FIG. 19 is a graph illustrating a relationship between drain voltage and drain current of the front-gate MISFET.

The front-gate MISFET 40 thus formed was examined to ascertain how the capacitance between the gate and the channel and the gate voltage were related to one another. Results are shown in FIG. 18. The results show that the MISFET 40, which is of the front-gate type, also ensures satisfactory transistor characteristics. The front-gate MISFET 40 thus formed was also examined to ascertain how the drain voltage and the drain current were related to one another at room-temperature. Results are shown in FIG. 19. The results show fair drain current-voltage characteristics, with a satisfactory saturation characteristic and a satisfactory pinch-off characteristic.

In addition to the MISFET 40, two other MISFETs were prepared, resulting in a total of three kinds of MISFETs. The MISFET 40 is an i-InGaAs-OI (On Insulator) MISFET having the un-doped channel with the carrier concentration $N_D$ of $\sim 1 \times 10^{15}$ cm$^{-3}$. One of the two other MISFETs is a p-InGaAs-OI MISFET having the doped channel with the carrier concentration $N_D$ of $3 \times 10^{16}$ cm$^{-3}$. As a reference, a p-InGaAs bulk MISFET on the InP substrate with the carrier concentration $N_D$ of $3 \times 10^{16}$ cm$^{-3}$ was also prepared. The p-InGaAs bulk MISFET is the other one of the two other MISFETs.

Figure 20:
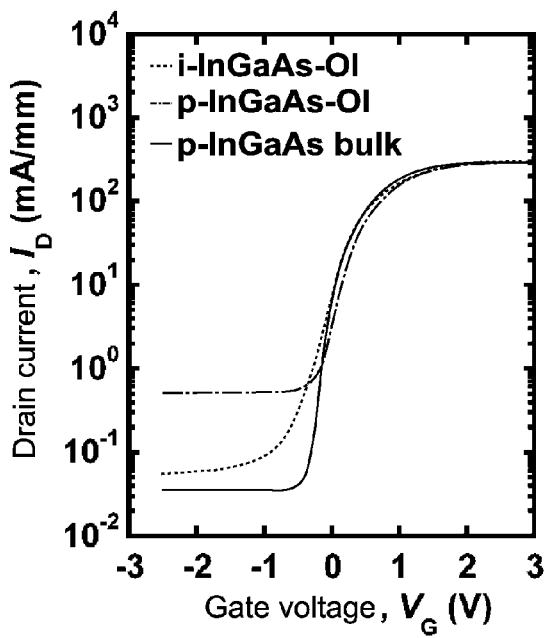
FIG. 20 is a graph illustrating a relationship between gate voltage and drain current of the front-gate MISFET.
Figure 21:
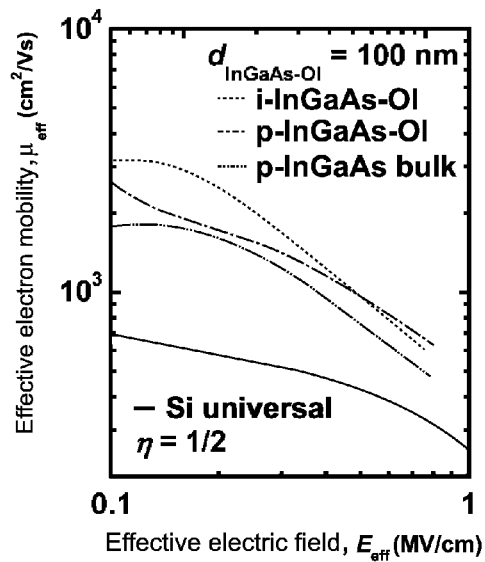
FIG. 21 is a graph illustrating a relationship between effective electric field and effective electron mobility of the front-gate MISFET.

The three i-InGaAs-OI MISFET, p-InGaAs-OI MISFET, p-InGaAs bulk MISFET were each examined to ascertain how the gate voltage and the drain current were related to one another, and to ascertain how the effective electron mobility and the effective electric field were related to one another. Results are shown in FIGS. 20 and 21. FIG. 20 shows a relationship between the gate voltage and the drain current. FIG. 21 shows a relationship between the effective electron mobility and the effective electric field. In FIGS. 20 and 21, "i-InGaAs-OI" indicates the i-InGaAs-OI MISFET, "p-InGaAs-OI" indicates the p-InGaAs-OI MISFET, and "p-InGaAs bulk" indicates the p-InGaAs bulk MISFET. The p-InGaAs was doped with Zn of $N_A = 3 \times 10^{16}$ cm$^{-3}$.

FIG. 20 shows that the i-InGaAs-OI MISFET and the p-InGaAs-OI MISFET are similar to the p-InGaAs bulk MISFET in satisfactory transistor characteristics. FIG. 21 shows that the i-InGaAs-OI MISFET and the p-InGaAs-OI MISFET are similar to the MISFET 1 according to the above-described embodiment in high effective electron mobility. Additionally, the results show that the front-gate MISFET 40 is capable of behavior of the double-gate structure, that is, capable of current control of the front gate side through the back gate.

The front-gate MISFET 40 may use the semiconductor substrate 30. The semiconductor substrate 30 has its group III-V compound semiconductor layer 7 terminated at a surface with S atoms in an ammonium sulfide solution so as to form the S treated surface 32 over the surface of group III-V compound semiconductor layer 7, similarly to "(5-1) Ammonium sulfide Solution Treatment". Over the S treated surface 32, the oxide layer 6 is formed. With such semiconductor substrate 30 bonded to the front-gate MISFET 40, when the group III-V compound semiconductor layer 7 has an ultra thin structure, the influence that the boundary between the group III-V compound semiconductor layer 7 and the oxide layer 6 (back-gate side) has on the boundary between the group III-V compound semiconductor layer 7 and the oxide layer 47 (front-gate side) is minimized. This facilitates the flow of current in operation from the source 44 to the drain 45.

In the embodiments, the oxide layer 47 of $Al_2O_3$ is used as the second insulating layer, which partially serves as the gate insulating layer. This, however, should not be construed in a limiting sense. The second insulating layer may use at least one of $Al_2O_3$, $SiO_2$, MN, SiN, SiON, $Ta_2O_5$, $ZrO_2$, $HfO_2$, $La_2O_3$, $Y_2O_3$, and a mixture of the foregoing. It is also possible to use a laminate of a plurality of the foregoing different insulating layers.

(5-3) MISFET according to Another Embodiment
(5-3-1) Configuration of MISFET

Figure 22:
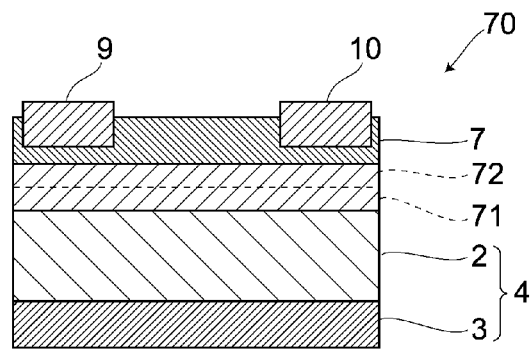
FIG. 22 is a schematic view of a cross-sectional structure (2) of the MISFET according to another embodiment.

In FIG. 22, corresponding elements to those shown in FIG. 1 are designated by the same reference numerals. Referring to FIG. 22, reference numeral 70 indicates a MISFET 70 according to another embodiment. A feature of the MISFET 70 is that an oxide layer 71 and an oxide layer 72 are bonded to one another in air at room-temperature. The oxide layer 71 is made of $Al_2O_3$ over another surface of the Si substrate 2. The oxide layer 72 is made of $Al_2O_3$ over the group III-V compound semiconductor layer 7 of InGaAs.

The MISFET 70 is also different from the above-described embodiment in that the bonding surfaces are not irradiated with Ar beams prior to the bonding of the substrates.

Specifically, in the MISFET 70, the oxide layer 71 serving as a substrate-side insulating layer is formed on the Si substrate 2 side. This ensures a firm bonding between the oxide layers 71 and 72 without the activation of the bonding surfaces by Ar beam irradiation. Thus, the MISFET 70 eliminates the need for Ar beam irradiation executed in the above-described embodiment, which in turn eliminates or minimizes damage to the Si substrate 2 associated with the Ar beam irradiation. A method for fabricating the MISFET 70 will be described below.

(5-3-2) Method for Fabricating the MISFET

Figures 23A, 23B, 23C, 23D:
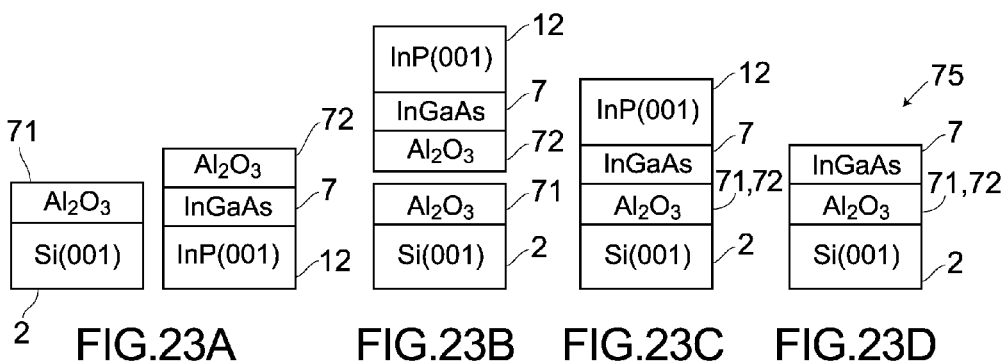
FIGS. 23A to 23D are schematic diagrams illustrating a method (2) for fabricating the MISFET according to another embodiment.

As shown in FIG. 23A, the oxide layer ($Al_2O_3$) 72 of a prescribed thickness for example, 4 nm to 44 nm) is formed over a surface of the group III-V compound semiconductor layer 7, which is over the InP substrate 12. This is by the use of an ALD equipment (not shown), which grows a thin film on a one atomic layer basis or on a one molecular layer basis.

As opposed to the above-described embodiment, in this embodiment, the oxide layer ($Al_2O_3$) 71 of a prescribed thickness (for example, 4 nm to 44 nm) is formed over a surface of the Si substrate 2 using the ALD equipment.

In this case, the ALD equipment forms the oxide layers using TMA ($Al(CH_3)_3$) and $H_2O$ as exemplary raw materials under exemplary conditions of 200° C. and a vacuum of equal to or less than 10 mbar with a TMA supply of 20 sccm to 100 sccm. The ALD equipment runs a cycle of, for example, 0.25 seconds of TMA supply, 0.5 seconds of nitrogen purging and vacuum evacuation, 0.25 seconds of $H_2O$ supply, and 1 second of nitrogen purging and vacuum evacuation. The growth rate is 0.11 nm per cycle. Thus, the oxide layers 71 and 72 of $Al_2O_3$ are respectively formed over the surface of the Si substrate 2 and the surface of the group III-V compound semiconductor layer 7. The ALD equipment runs a cycle of alternate TMA supply and $H_2O$ supply, ending with a $H_2O$ supply. This results in OH-termination on the surfaces of the oxide layers 71 and 72, which are respectively formed over the Si substrate 2 and the group III-V compound semiconductor layer 7.

Next is direct substrate bonding as shown in FIGS. 23B and 23C. Specifically, the oxide layer 71 over the Si substrate 2 and the oxide layer 72 over the group III-V compound semiconductor layer 7 over the InP substrate 12 are bonded to one another in air at room-temperature. In practice, the oxide layer 71 disposed over the Si substrate 2 and the oxide layer 72 over the group III-V compound semiconductor layer 7 over the InP substrate 12 are placed in opposing orientation. Then in a vacuum, the oxide layers 71 and 72 are brought into close contact with one another followed by heat treatment. This improves the bonding strength and ensures a high quality semiconductor substrate.

Specifically, the oxide layer 71 over the Si substrate 2 and the oxide layer 72 over the group III-V compound semiconductor layer 7 of the InP substrate 12 are thin films that are formed on a one atomic layer basis or on a one molecular layer basis by the ALD equipment. In addition to flattening the surfaces of the oxide layers 71 and 72, this makes the surfaces hydrophilic due to OH-termination, as shown in FIG. 24A. This, in turn, ensures that in the bonding of the substrates at the oxide layers 71 and 72, heat treatment causes dehydration condensation of the oxide layers 71 and 72 at their OH-terminated hydrophilic surfaces, resulting in a firm bonding and integration between the oxide layers 71 and 72, as shown in FIGS. 24B and 24C. Thus, the group III-V compound semiconductor layer 7 is formed over the surface of the Si substrate 2 across the oxide layers 71 and 72.

Next, as shown in FIG. 23D, the InP substrate 12 is selectively removed from the surface of the group III-V compound semiconductor layer 7. This is by the use of a solution of HCl or a solution of HCl and phosphoric acid ($H_3PO_4$) at a content ratio in the range of 1:4 to 1:1, similarly to the above-described embodiment. Thus, the semiconductor substrate 75 is formed. Then, the source 9, the drain 10, and the Al gate electrode 3 are formed, similarly to the above-described embodiment. Thus, the MISFET 70 shown in FIG. 22 is fabricated. In this embodiment, it is also possible to execute "(5-1) Ammonium sulfide Solution Treatment". In this case, the S treated surface 32 causes an effect of reducing surface electric charge (surface dipole scattering), resulting in improved effective electron mobility, similarly to the above-described embodiment.

(5-3-3) Performance and Advantageous Effects

In the MISFET 70, the oxide layer 72 is formed over the surface of the group III-V compound semiconductor layer 7, while the oxide layer 71 (substrate-side insulating layer) is formed over the surface of the Si substrate 2 by ALD. This makes the surfaces of the oxide layers 71 and 72 flat and OH-terminated. Thus, the MISFET 70 ensures a firm bonding and integration between the oxide layers 71 and 72 at their OH-terminated hydrophilic surfaces without the activation of the bonding surfaces by Ar beam irradiation.

The MISFET 70 eliminates the need for Ar beam irradiation, which in turn eliminates or minimizes damage to the surface of the Si substrate 2 associated with the Ar beam irradiation, and eliminates or minimizes damage to the oxide layers 71 and 72 ($Al_2O_3$) themselves, which serve as insulating layers at the time of back-gate operations. In accordance with the minimization of influence of the damage, the effective electron mobility improves.

While in this embodiment $Al_2O_3$ is used as the oxide layers 71 and 72, this should not be construed in a limiting sense. It is also possible to use oxide layers of other various kinds of oxides capable of OH-termination. Examples include, but not limited to, $SiO_2$, $Ta_2O_5$, $ZrO_2$, and $HfO_2$.

(5-3-4) Estimations of the Semiconductor Substrate according to Another Embodiment Next, the semiconductor substrate 75 and the MISFET 70 according to another embodiment were subjected to various estimations. First, the Si substrate 2 was prepared, and the oxide layer 71 of $Al_2O_3$ and of 5.5 nm thick was formed over the Si substrate 2 using an ALD equipment. Specifically, the ALD equipment formed the oxide layer 71 using TMA ($Al(CH_3)_3$) and $H_2O$ as raw materials under conditions of 200° C. and a vacuum of equal to or less than 10 mbar with a TMA supply of 20 sccm to 100 sccm. The ALD equipment ran a cycle of, for example, 0.25 seconds of TMA supply, 0.5 seconds of nitrogen purging and vacuum evacuation, 0.25 seconds of $H_2O$ supply, and 1 second of nitrogen purging and vacuum evacuation. The growth rate was 0.11 nm per cycle. The cycle ended with a $H_2O$ supply, making the surface of the oxide layer 71 OH-terminated. At the time of forming the oxide layer 71, the ALD ends with a $H_2O$ supply, making the surface of the oxide layer 71 OH-terminated.

Then, the oxide layer 71 was observed under an AFM. Results are shown in FIG. 25 (which are results of the ALD equipment running 50 cycles). As shown in FIG. 25, the oxide layer 71 has, on its bonding surface, fine protrusions and depressions (micro-roughness), proving a flatness (surface roughness $R_{rms}$ of 0.187 nm) sufficient for bonding of the substrates.

Next, an additional Si substrate 2 with the oxide layer 71 was fabricated. The oxide layers 71 of the two Si substrates 2 were brought into close contact with one another and bonded to one another. This substrate bonding at the oxide layers 71 ensures a firm bonding at room-temperature without any particular heat treatment. For the purpose of improving the bonding strength, heat treatment was executed in this example in a vacuum after the bonding at room-temperature.

Specifically, the bonding at room-temperature was followed by 15 minutes of 330° C. heat treatment. This was followed by a blade test, inserting a razor (blade) into the gap between the Si substrates 2 so as to estimate the bonding strength of the Si substrates 2. FIG. 26 is an infrared (IR) image of the oxide layers 71 of the two Si substrates 2 bonded to one another and subjected to the blade test. As shown in FIG. 26, the bonding is so firm that a bulk destruction is caused on the Si substrates 2.

Next, a separate InGaAs layer (group III-V compound semiconductor layer 7) of $In_{0.53}Ga_{0.47}As$ was formed over a surface of the InP substrate 12. In accordance with "(5-1) Ammonium sulfide Solution Treatment", a surface of the group III-V compound semiconductor layer 7 was immersed in an ammonium sulfide solution, forming the S treated surface 32. Then, the oxide layer 72 of $Al_2O_3$ was formed over the group III-V compound semiconductor layer 7 using an ALD equipment. Specifically, the ALD equipment formed the oxide layer 72 using raw material TMA under conditions of the substrate temperature of 200° C. and a vacuum of equal to or less than 10 mbar. The ALD equipment ran a cycle of 0.25 seconds of TMA supply, 0.5 seconds of nitrogen purging and vacuum evacuation, 0.25 seconds of $H_2O$ supply, and 1 second of nitrogen purging and vacuum evacuation. The growth rate was 0.11 nm per cycle. The cycle ended with a $H_2O$ supply, making the surface of the oxide layer 72 OH-terminated.

Figure 27:
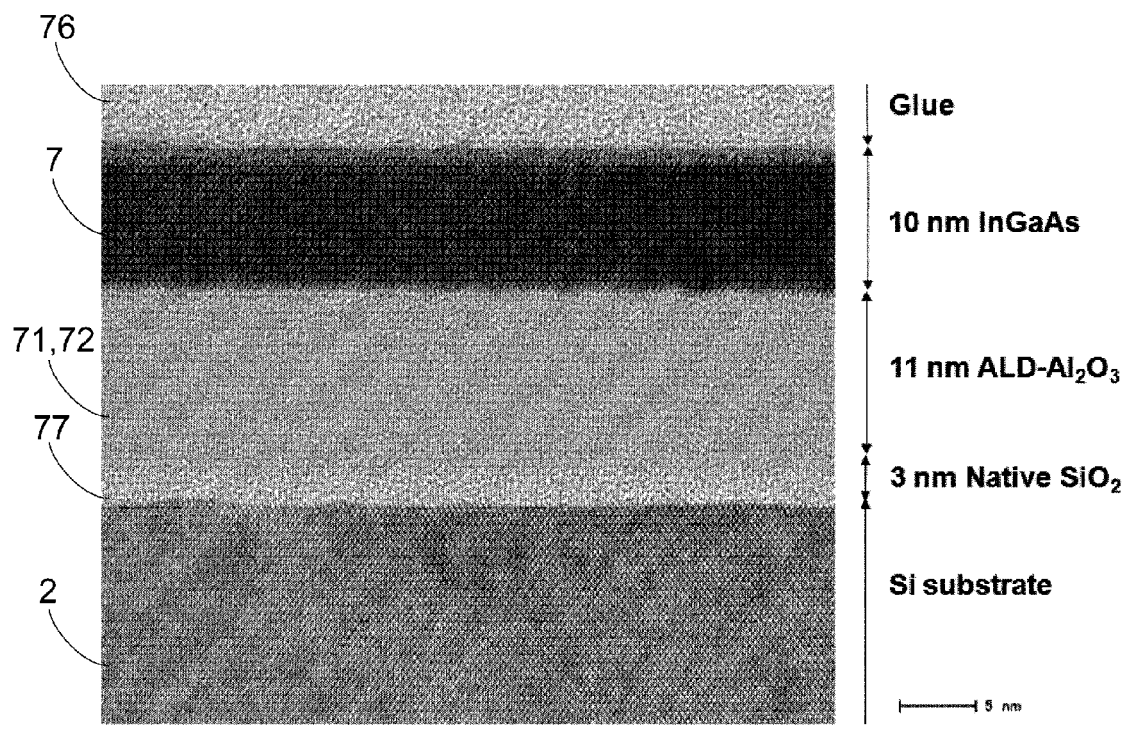
FIG. 27 is a TEM image of an interface (1) between the group III-V compound semiconductor layer and an oxide layer according to another embodiment.
Figure 28:
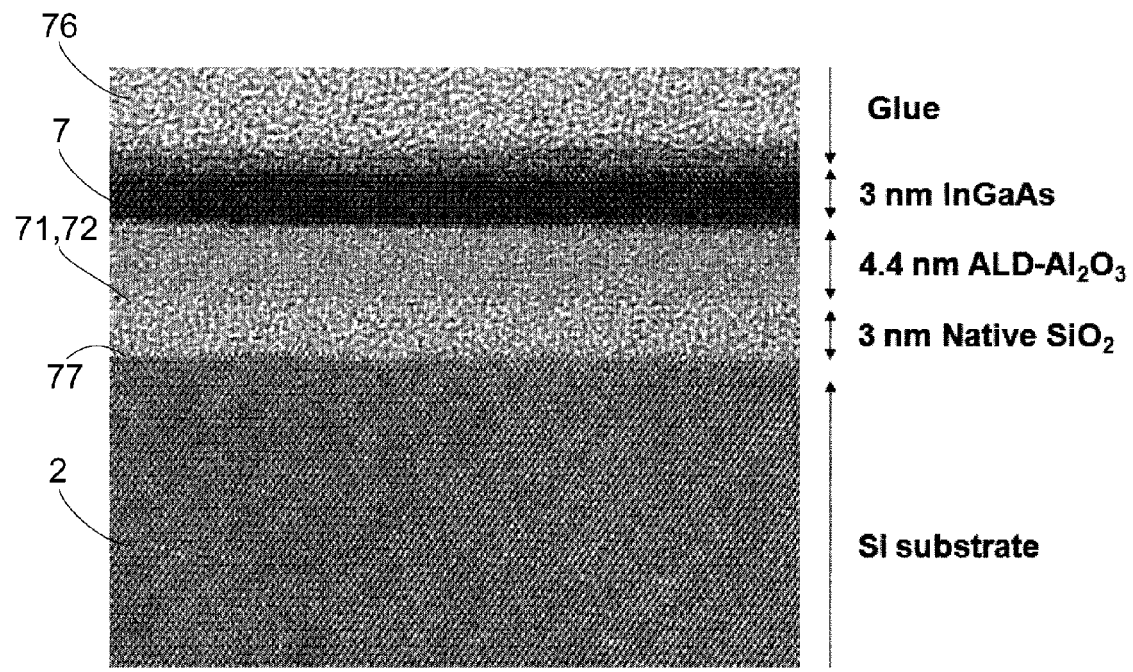
FIG. 28 is a TEM image of an interface (2) between the group III-V compound semiconductor layer and an oxide layer according to another embodiment.

Next, the oxide layer 71 of the Si substrate 2 and the oxide layer 72 over the group III-V compound semiconductor layer 7 of the InP substrate 12 were bonded to one another at room-temperature. Then, the InP substrate 12 was removed using, for example, a solution of HCl. Thus, a semiconductor substrate was fabricated having the group III-V compound semiconductor layer 7 of InGaAs film formed over the Si substrate 2 across the oxide layers 71 and 72. In practice, using an etching sacrificial layer of InGaAs/InP ensures uniform thickness even for an ultrathin film III-V-OI channel layer of 10 nm or less thick. Next, an adhesion material was solidified over the group III-V compound semiconductor layer 7 of the semiconductor substrate. The obtained combination was photographed for its cross-sectional TEM image, which is shown in FIG. 27. As shown in FIG. 27, the III-V MOS interface and the bonding interface are highly satisfactory. In FIG. 27, "Glue" at 76 indicates a layer of adhesion material for use in TEM observation, while "3 nm Native $SiO_2$" at 77 indicates a natural oxide layer formed over the Si substrate. FIG. 28 is a cross-sectional TEM image with the thicknesses of the group III-V compound semiconductor layer 7 and the oxide layers 71 and 72 varied due to changes in the film forming conditions. As shown in FIG. 28, the III-V MOS interface and the bonding interface in this case are also highly satisfactory.

(5-3-5) Estimations of the MISFET according to Another Embodiment

Next, under conditions of 200° C. and a vacuum of equal to or less than 10 mbar, the ALD equipment ran a cycle of 0.25 seconds of raw material TMA supply, 0.5 seconds of nitrogen purging and vacuum evacuation, 0.25 seconds of $H_2O$ supply, and 1 second of nitrogen purging and vacuum evacuation. The growth rate was 0.11 nm per cycle. The cycle ended with a $H_2O$ supply, making the surface of the oxide layer 71 OH-terminated. Such oxide layer 71 was formed over the Si substrate 2.

Next, a separate InP substrate 12 was prepared, and InGaAs was epitaxially grown over the surface of the InP substrate 12 to form the group III-V compound semiconductor layer 7. The surface of the group III-V compound semiconductor layer 7 was immersed in an ammonium sulfide solution to form the S treated surface 32. Next, the OH-terminated oxide layer 72 of $Al_2O_3$ was formed over the surface of the group III-V compound semiconductor layer 7 using the ALD equipment under similar conditions to the above-described film forming conditions.

Next, the oxide layers 71 and 72 were bonded to one another without irradiation of Ar beams to the oxide layers 71 and 72. This was followed by the steps of removing the InP substrate 12, forming the source 9 and the drain 10, and forming the Al gate electrode 3 over the rear surface of the Si substrate 2 under similar conditions to those described in "(4) Examples". This resulted in the MISFET shown in FIG. 22.

Figure 29:
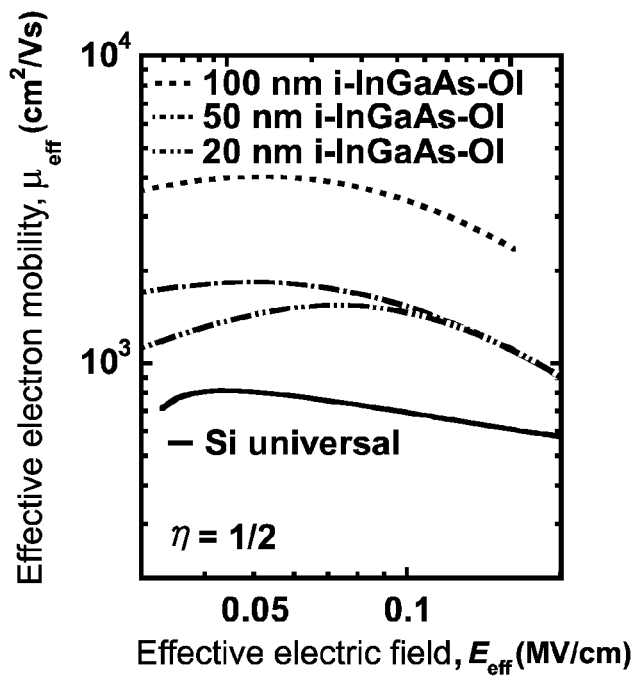
FIG. 29 is a graph illustrating a relationship (2) between effective electron mobility and effective electric field of the MISFET according to another embodiment.

In this example, the total thickness of the oxide layers 71 and 72 bonded to one another was approximately 11 nm. Three different MISFETs were prepared having group III-V compound semiconductor layers 7 of 100 nm, 50 nm, and 20 nm thick. The three MISFETs were examined to ascertain their transistor performance. FIG. 29 is a graph illustrating a relationship between the effective electron mobility and the effective electric field of each MISFET at room-temperature, and illustrating how this relationship depends on the film thickness of the group III-V compound semiconductor layer 7. In FIG. 29, "Si universal" indicates a Si nMOSFET, with an n-channel MOSFET formed on the Si substrate.

Figure 30:
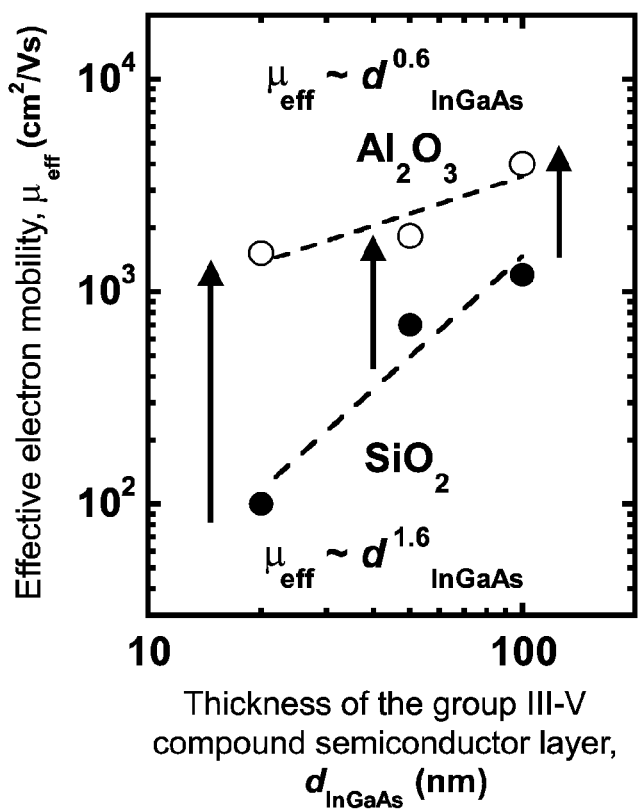
FIG. 30 is a graph illustrating a relationship between effective electron mobility of the MISFET and thickness of the group III-V compound semiconductor layer according to another embodiment.

FIG. 29 shows that all the MISFETs exhibit high mobility and high effective electron mobility compared with "Si universal". The maximum effective electron mobility is up to 4000 $cm^2/Vs$, which is approximately five times higher than the effective electron mobility of "Si universal". FIG. 30 is a graph illustrating a relationship between the peak mobility of the effective electron mobility of each MISFET and the thickness of the corresponding group III-V compound semiconductor layer 7.

In FIG. 30, "$SiO_2$" indicates a comparative MISFET. The comparative MISFET includes an oxide layer of $SiO_2$ formed over the Si substrate by thermal oxidation and another oxide layer of $SiO_2$ formed over the group III-V compound semiconductor layer 7 by electron cyclotron resonance (ECR) plasma. These oxide layers are bonded to one another.

As shown in FIG. 30, the MISFET including the oxide layer 71 formed over the surface of the Si substrate 2 by ALD and the S treated surface 32 formed over the surface of the group III-V compound semiconductor layers 7 has a higher effective electron mobility than the effective electron mobility of the MISFET ("$SiO_2$" in FIG. 30) including the ECR-sputtered $SiO_2$ BOX layer.

Thus, in this embodiment, a S treated surface 32 is formed over the surface of the group III-V compound semiconductor layer 7, and additionally, no Ar beam irradiation is executed prior to the bonding of the substrates. This eliminates or minimizes the possibility of damage that the Ar beam irradiation can cause to the Si substrate 2, the oxide layers 71 and 72, and the group III-V compound semiconductor layer 7. Thus, a further improvement has been confirmed regarding the effective electron mobility.

(5-3-6) Double-Gate MISFET

Figure 31:
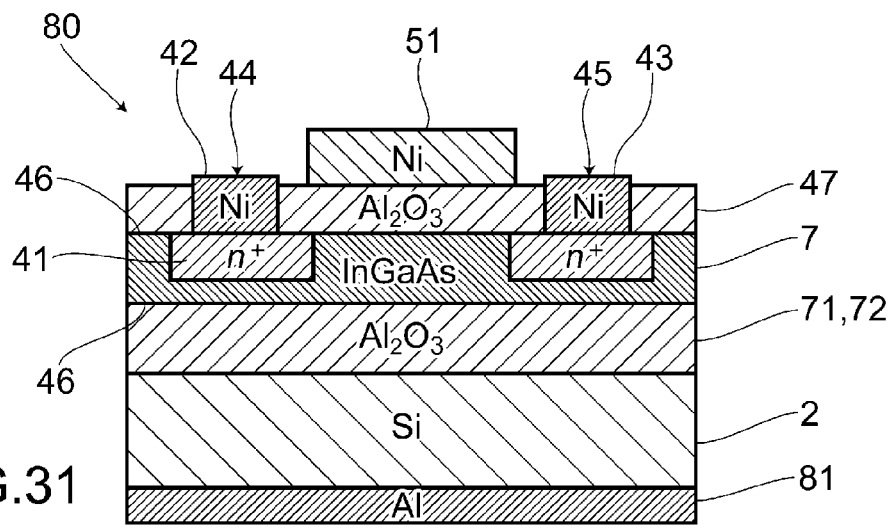
FIG. 31 is a schematic view of a cross-sectional structure of a double-gate MISFET.

Next, the semiconductor substrate 75 fabricated according to the process shown in FIGS. 23A to 23D was used to fabricate a double-gate MISFET. In FIG. 31, corresponding elements to those shown in FIG. 16 are designated by the same reference numerals. Referring to FIG. 31, reference numeral 80 indicates a double-gate MISFET. In the fabrication process of the double-gate MISFET 80, the oxide layer 71 of $Al_2O_3$ over another surface of the Si substrate 2 and the oxide layer 72 of $Al_2O_3$ over the group III-V compound semiconductor layer 7 of InGaAs are bonded to one another in air at room-temperature with or without Ar beam irradiation to the bonding surfaces.

The double-gate MISFET 80 includes a source electrode 42 of nickel (Ni) and a drain electrode 43 of Ni over their respective corresponding doped layers 41. The source electrode 42 and its corresponding doped layer 41 form a source 44, while the drain electrode 43 and its corresponding doped layer 41 form a drain 45. The MISFET 80 also includes a gate 51 of Ni over the region of the group III-V compound semiconductor layer 7 corresponding to the channel layer between the source 44 and the drain 45 across the oxide layer 47. The MISFET 80 also includes an Al electrode 81 of a prescribed thickness disposed over one surface of the Si substrate 2 as if to oppose to the gate 51. The Si substrate 2 and the Al electrode 81 serve as back bias electrodes. Thus, in the MISFET 80, applying a gate voltage to the gate 51 as a front-gate electrode and applying a back bias to the Al electrode 81, which is opposed to the gate 51, adjust the substrate voltage. Also in the MISFET 80, applying a drain voltage between the source 44 and the drain 45 causes a flow of current from the source 44 to the drain 45.

In this embodiment, the semiconductor substrate 75 is fabricated in accordance with the fabrication process shown in FIGS. 23A to 23D. In this process, S treated surfaces 46 terminated with S atoms in an ammonium sulfide solution are formed over one face and the other surface of the group III-V compound semiconductor layer 7, similarly to "(5-1) Ammonium Sulfide Solution Treatment". Accordingly, in the semiconductor substrate 75, the oxide layer 47 is formed over the S treated surface 46 on the one surface side of the group III-V compound semiconductor layer 7, while the oxide layer 72 is formed over the S treated surface 46 on the other surface side of the group III-V compound semiconductor layer 7.

Then, the semiconductor substrate 75 is used to form the doped layers 41 over the group III-V compound semiconductor layer 7 in accordance with the fabrication process shown in FIGS. 17A to 17D. Then, the oxide layer 47 of $Al_2O_3$ and the Ni layers of Ni are formed in this order over the group III-V compound semiconductor layer 7. Then, the oxide layer 47 and the Ni layers are processed into the gate 51, the source electrode 42, and the drain electrode 43. The formation of the gate 51, the source electrode 42, and the drain electrode 43 is as shown in FIGS. 36A to 36C and 37A to 37C, and will be described in detail later. Finally, the Al electrode 81, serving as a second gate electrode, is formed to over one surface of the Si substrate 2. Thus, the MISFET 80 shown in FIG. 31 is fabricated.

Figure 32:
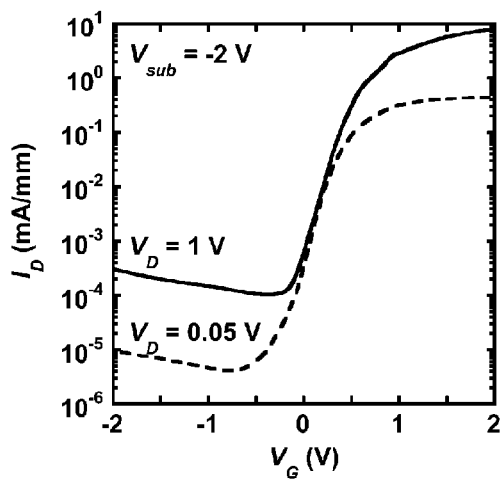
FIG. 32 is a graph illustrating a relationship (1) between gate voltage and drain current of the double-gate MISFET.
Figure 33:
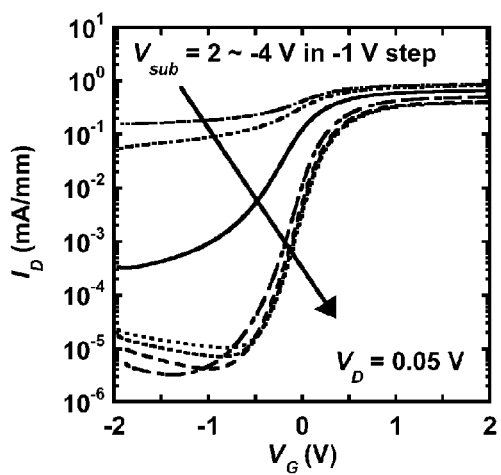
FIG. 33 is a graph illustrating a relationship (2) between gate voltage and drain current of the double-gate MISFET.

The MISFET 80 thus fabricated was examined to ascertain how the drain current and the gate voltage were related to one another at room-temperature. Results are shown in FIGS. 32 and 33. FIG. 32 shows a relationship between the drain current and the gate voltage at a voltage of −2 V applied to the Al electrode 81, which serves as a back bias electrode, and at a drain voltage of 1 V and 0.05 V. FIG. 32 shows fair drain current-voltage characteristics, with a satisfactory saturation characteristic.

Figure 34:
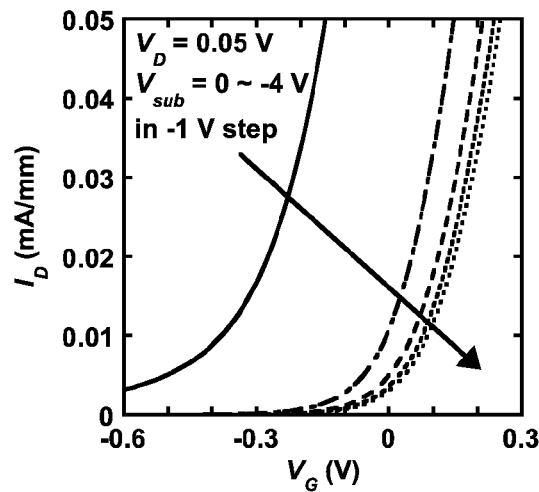
FIG. 34 is a partially enlarged part of the graph of FIG. 33.

FIG. 33 shows a relationship between the drain current and the gate voltage at a voltage of 2 V to −4 V applied to the Al electrode 81, which serves as a back bias electrode, and at a drain voltage of 0.05 V. FIG. 34 is a partially enlarged part of the graph of FIG. 33. As shown in FIGS. 33 and 34, an arrow points diagonally downward with lines crossing the arrow. These lines indicate the results of the estimation at back biases of 2 V, 1 V, 0 V, −1 V, −2 V, −3 V, and −4 V in this order starting at the beginning of the arrow.

FIG. 33 shows that varying the back bias applied to the Al electrode 81 ensures modulation of the drain current-voltage characteristics including the pinch-off characteristic. Thus, it has been confirmed that the MISFET 80 is capable of current control of the front-gate side through the back-gate.

Figure 35:
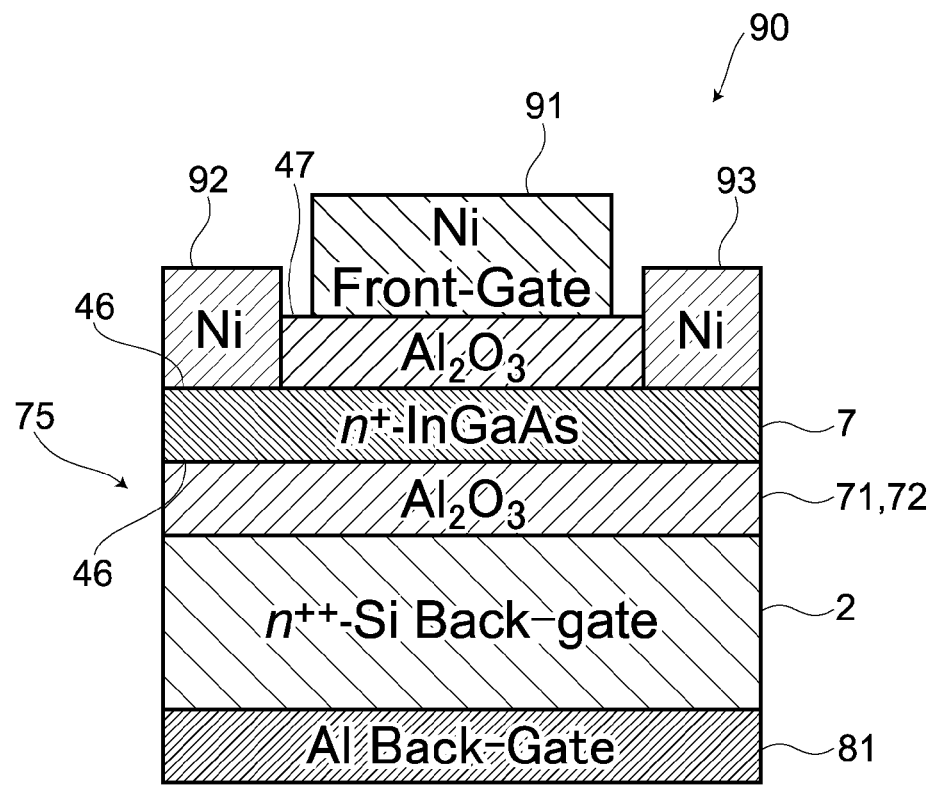
FIG. 35 is a schematic view of a cross-sectional structure of the double-gate MISFET according to another embodiment.

(5-4) Double-Gate MISFET according to Another Embodiment (5-4-1) Overview of Double-Gate MISFET In FIG. 35, corresponding elements to those shown in FIG. 31 are designated by the same reference numerals. Referring to FIG. 35, reference numeral 90 indicates a double-gate MISFET 90. The double-gate MISFET 90 is different from the MISFET 80 in that no doped layers 41 are formed. The MISFET 90 includes a source 92 of Ni and a drain 93 of Ni each formed over the group III-V compound semiconductor layer 7.

In practice, the MISFET 90 is not subjected to ion implantation or annealing in the fabrication process of the source 92 and the drain 93, respectively serving as the source electrode and the drain electrode. This eliminates the need for taking ion implantation and annealing into consideration and for securing a prescribed or greater thickness of the group III-V compound semiconductor layer 7. This ensures that the group III-V compound semiconductor layer 7 may be as thin as, for example, approximately 3 nm to 9 nm, leading to a reduced total thickness of the MISFET 90.

The MISFET 90 includes the oxide layer 47 of $Al_2O_3$ over the S treated surface 46 of the group III-V compound semiconductor layer 7, which forms a channel layer between the source 92 and the drain 93. A gate 91 of Ni is disposed over the oxide layer 47, which serves as the second insulating layer. In the MISFET 90, the Si substrate 2 and the Al electrode 81 are disposed in opposition to the gate 91, which serves as a front-gate electrode. The Si substrate 2 and the Al electrode 81 serve as back bias electrodes. In the MISFET 90, applying a gate voltage to the gate 91 and applying a back bias to the Al electrode 81 adjust the substrate voltage. Also in the MISFET 90, applying a drain voltage between the source 92 and the drain 93 causes a flow of current from the source 92 to the drain 93.

(5-4-2) Method for Fabricating Double-Gate MISFET

The MISFET 90 may be fabricated in the following manner. The semiconductor substrate 75 is used for fabricating the MISFET 90 and is fabricated in accordance with the process shown in FIGS. 23A to 23D. In the fabrication process of the semiconductor substrate 75, the S treated surfaces 46 terminated with S atoms in an ammonium sulfide solution are formed over one face and the other surface of the group III-V compound semiconductor layer 7, similarly to "(5-1) Ammonium sulfide Solution Treatment".

Next, a resist is applied over the group III-V compound semiconductor layer 7 of the semiconductor substrate 75. The resist is exposed through a prescribed mask to form a resist pattern. Then, the group III-V compound semiconductor layer is etched using a solution of $H_3PO_4$, $H_2O_2$, and $H_2O$ at a content ratio of 1:1:7 (other examples including, but not limited to, a solution of $H_3PO_4$:$H_2O_2$:$H_2O$ and a solution of $H_2SO_4$:$H_2O_2$:$H_2O$). Thus, as shown in FIG. 36A, the semiconductor substrate 75 including the group III-V compound semiconductor layer 7 in a prescribed shaped is fabricated. The oxide layers 71 and 72 are indicated "BOX 96".

Next, as shown in FIG. 36B, the oxide layer 47 of $Al_2O_3$ is formed over the group III-V compound semiconductor layer 7 in a prescribed shape using an ALD equipment. Then, as shown in FIG. 36C, a Ni layer 95 of Ni is formed over the oxide layer 47 by electron beam (EB) deposition or other method. Next, as shown in FIG. 37A, the Ni layer 95 is processed into a prescribed shape by lifting off (or by lithography and etching) so as to form the gate 91 over the oxide layer 47. Then as shown in FIG. 37B, the oxide layer 47 is removed excluding a part of it adjacent the gate 91 so as to expose the group III-V compound semiconductor layer 7 to ambient.

Next, as shown in FIG. 37C, the source 92 of Ni and the drain 93 of Ni are formed by lifting off (or by lithography and etching) over the group III-V compound semiconductor layer 7 with the oxide layer 47, over which the gate 91 is formed, held between the source 92 and the drain 93. Thus, no ion implantation or annealing is executed in the fabrication process of the source 92 and the drain 93. This eliminates the need for taking ion implantation and annealing into consideration and for securing a prescribed or greater thickness of the group III-V compound semiconductor layer 7. This facilitates the attempt to make the group III-V compound semiconductor layer 7 thin. Finally, the Al electrode 81 is formed over one surface of the Si substrate 2. Thus, the MISFET 90 shown in FIG. 35 is fabricated.

(5-4-3) Estimation Results

Figure 38A:
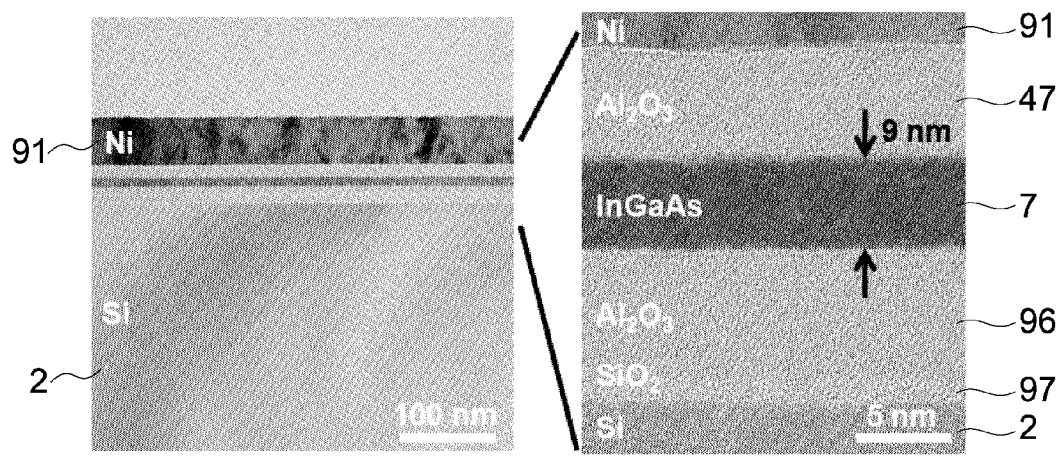
FIG. 38A is a TEM image illustrating a schematic view of a cross-sectional structure of a group III-V compound semiconductor layer of 9 nm thick.
Figure 38B:
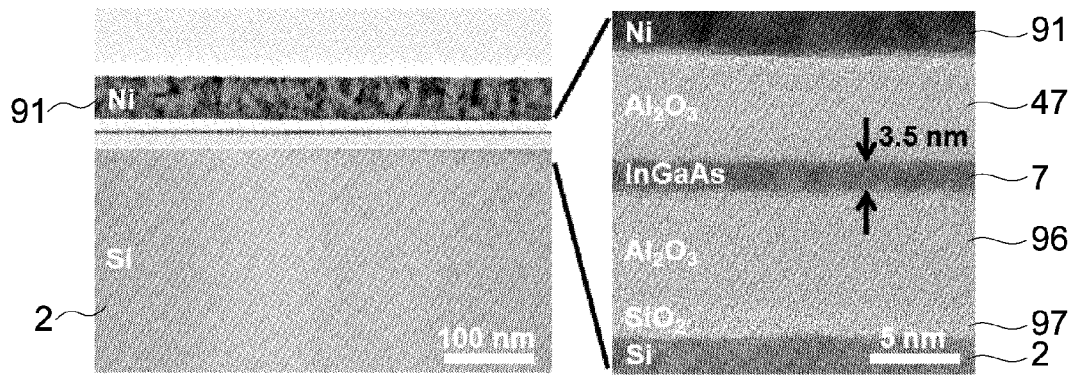
FIG. 38B is a TEM image illustrating a schematic view of a cross-sectional structure of a group III-V compound semiconductor layer of 3.5 nm thick.

Next, the double-gate MISFET 90 thus fabricated was subjected to various estimations. Specifically, two double-gate MISFETs 90 were fabricated in accordance with the above-described method for fabrication. One of the two double-gate MISFETs 90 includes an approximately 9-nm-thick group III-V compound semiconductor layer 7, as shown in FIG. 38A. The other one of the two double-gate MISFETs 90 includes an approximately 3.5-nm-thick group III-V compound semiconductor layer 7, as shown in FIG. 38B. As shown in FIGS. 38A and 38B, a $SiO_2$ layer 97 results from natural oxidization of the Si substrate 2 in the fabrication process. In FIG. 2B, the $SiO_2$ layer 97 may be formed over the Si substrate 2 or removed using, for example, hydrogen fluoride.

Figure 39A:
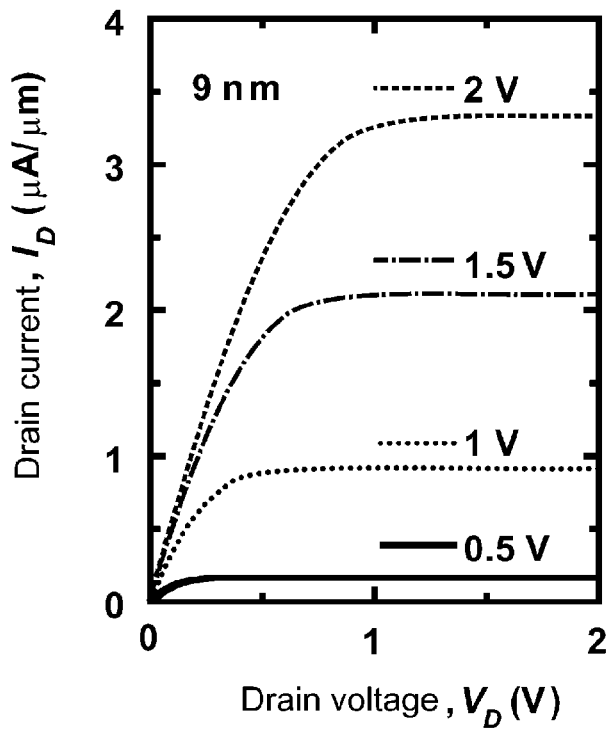
FIGS. 39A and 39B are graphs illustrating relationships between drain voltage and drain current of the double-gate MISFET.
Figure 39B:
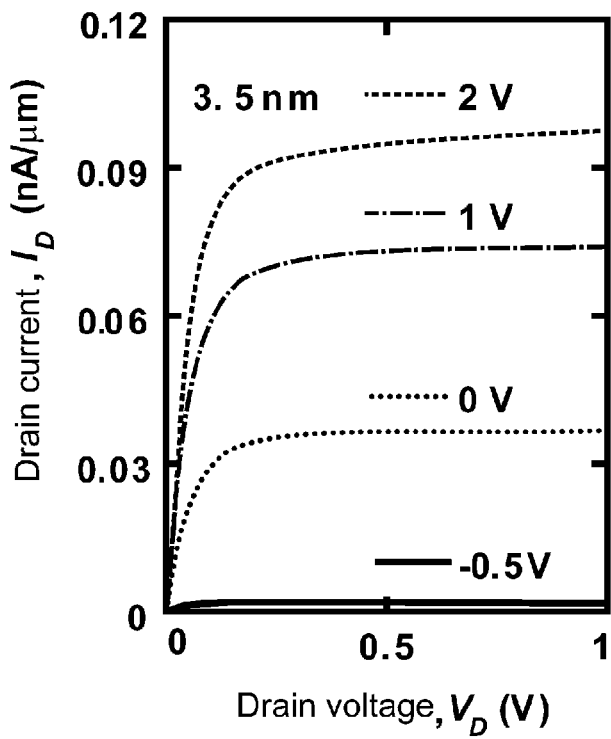

Next, the MISFETs 90 were each examined to ascertain how the drain voltage and the drain current were related to one another with a voltage applied to the gate 91 into front-gate operation at room-temperature. Results are shown in FIGS. 39A and 39B. The results show fair drain current-voltage characteristics, with a satisfactory saturation characteristic and a satisfactory pinch-off characteristic.

Figure 40A:
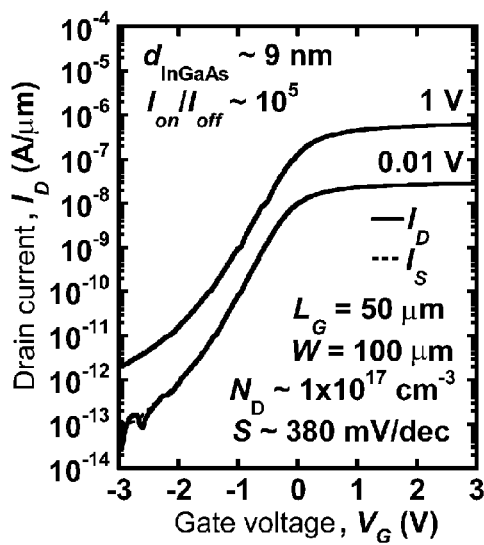
FIGS. 40A to 40C are graphs illustrating relationships between gate voltage and drain current associated with a front-gate operation of double-gate MISFETs of different carrier densities.
Figure 40B:
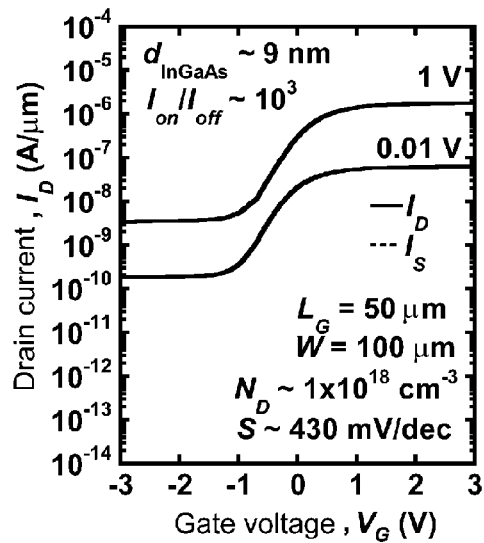
Figure 40C:
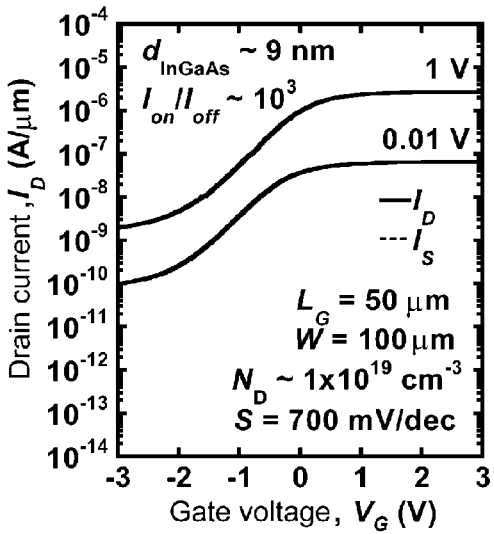

Next, the MISFET 90 including the approximately 9-nm-thick group III-V compound semiconductor layer 7 was examined to ascertain how the gate voltage and the drain current were related to one another with a voltage applied to the gate 91 into front-gate operation at room-temperature at a carrier density $N_D$ of $1\times10^{17}$ $cm^{-3}$, $1\times10^{18}$ $cm^{-3}$, and $1\times10^{19}$ $cm^{-3}$. Results are shown in FIGS. 40A, 40B, and 40C. The carrier density $N_D$ was adjusted by Si doping in the group III-V compound semiconductor layer 7 during its formation. For fabrication of an n-type InGaAs layer, S doping or other material doping is possible, as well as Si doping.

As described above, $L_G$ indicates the channel length of the group III-V compound semiconductor layer 7 (InGaAs film) between the source 92 and the drain 93, while W indicates the width of the channel layer. $I_S$ indicates the source current. The relationship between the gate voltage and the source current has been proved to be similar to the relationship between the gate voltage and the drain current. For ease of description, the drain current will be a focus of the following estimations, including the drawings that follow.

FIG. 40A shows that at a carrier density $N_D$ of $1\times10^{17}$ $cm^{-3}$, the current on/off ratio $I_{on}/I_{off}$ is $10^5$, which is a ratio between "ON" and "OFF" of operation, and the subthreshold slope S is 380 mV/decade. FIG. 40B shows that at a carrier density $N_D$ of $1\times10^{18}$ $cm^3$, the current on/off ratio $I_{on}/I_{off}$ is $10^{-3}$ and the subthreshold slope S is 430 mV/decade. FIG. 40C shows that at a carrier density $N_D$ of $1\times10^{19}$ $cm^{-3}$, the current on/off ratio $I_{on}/I_{off}$ is $10^{-3}$ and the subthreshold slope S is 700 mV/decade. These results show that the MISFET 90 including the approximately 9-nm-thick group III-V compound semiconductor layer 7 has satisfactory MOS characteristics.

Figure 41:
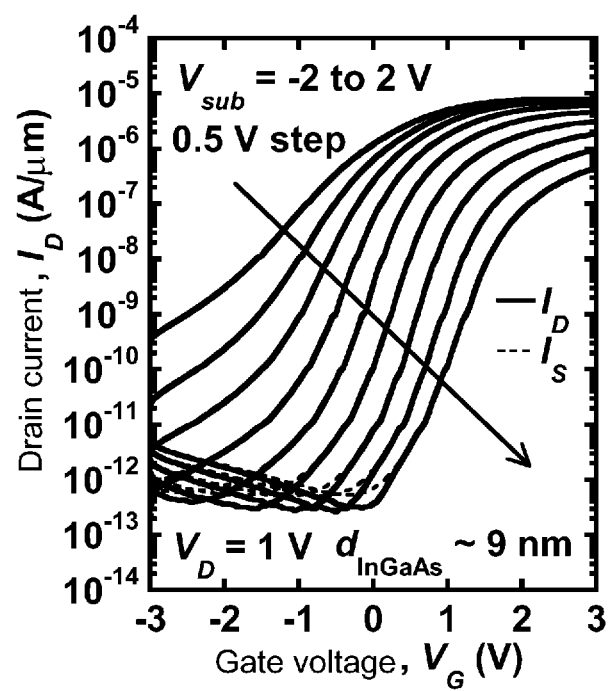
FIG. 41 is a graph illustrating a relationship (1) between gate voltage and drain current of the double-gate MISFET according to another embodiment.

FIG. 41 shows a relationship between the drain current and the gate voltage of the MISFET 90, where the group III-V compound semiconductor layer 7 is approximately 9 nm thick and has a carrier density $N_D$ of $1\times10^{17}$ $cm^{-3}$, at a voltage of −2 V to 2 V applied to the Al electrode 81, which serves as a back bias electrode, and at a drain voltage of 1 V. As shown in FIG. 41, an arrow points diagonally downward with lines crossing the arrow. These lines indicate the results of the estimation at back biases of −2 V, −1.5 V, −1 V, −0.5 V, 0 V, 0.5 V, 1 V, 1.5 V, and 2 V in this order starting at the beginning of the arrow.

FIG. 41 shows that varying the back bias applied to the Al electrode 81 ensures modulation of the drain current-voltage characteristics including the pinch-off characteristic. Thus, it has been confirmed that the MISFET 90 is capable of current control of the front-gate side through the back-gate.

Figure 42A:
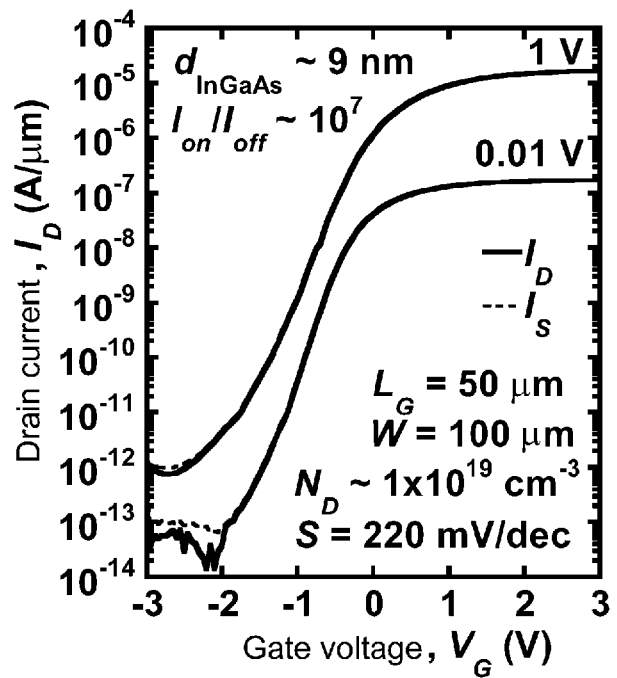
FIGS. 42A and 42B are graphs illustrating a relationship (2) between gate voltage and drain current of the double-gate MISFET according to another embodiment.

The MISFET 90 including the group III-V compound semiconductor layer 7 of approximately 9-nm-thick and of $1\times10^{19}$ $cm^{-3}$ carrier density $N_D$ was examined to ascertain how the gate voltage and the drain current were related to one another while the MISFET 90 was in double-gate operation. Results are shown in FIG. 42A. FIG. 42A shows that at a carrier density $N_D$ of $1\times10^{19}$ $cm^{-3}$, the current on/off ratio $I_{on}/I_{off}$ is as high as $10^7$, and the subthreshold slope S is as low as 220 mV/decade. Thus, it has been confirmed that the MISFET 90 in double-gate operation significantly improves the current on/off ratio $I_{on}/I_{off}$ and the subthreshold slope S.

Figure 42B:
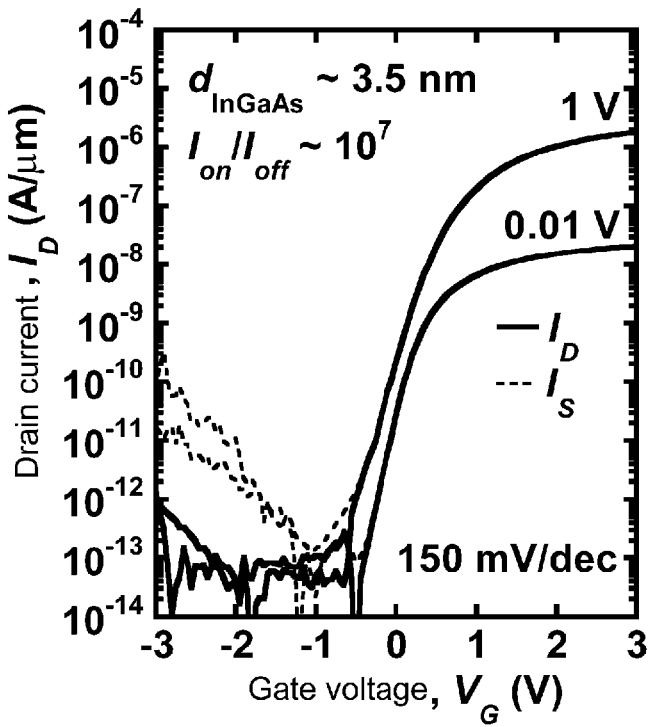

The MISFET 90 including the group III-V compound semiconductor layer 7 of approximately 3.5-nm-thick and of $1\times10^{17}$ $cm^{-3}$ carrier density $N_D$ was examined to ascertain how the gate voltage and the drain current were related to one another while the MISFET 90 was in double-gate operation. Results are shown in FIG. 42B. FIG. 42B shows that at a carrier density $N_D$ of $1\times10^{19}$ $cm^3$, the current on/off ratio $I_{on}/I_{off}$ is as high as $10^7$, and the subthreshold slope S is as low as 150 mV/decade. Thus, it has been confirmed that the MISFET 90 in double-gate operation significantly improves the current on/off ratio $I_{on}/I_{off}$ and the subthreshold slope S.

Figure 43A:
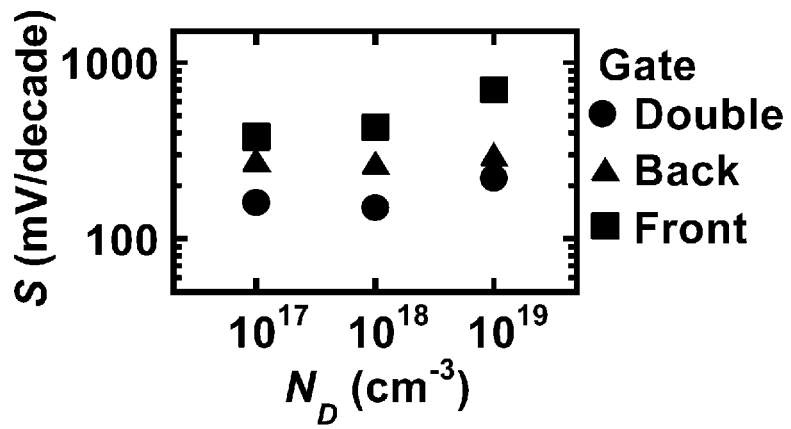
FIG. 43A is a graph illustrating dependency of an sub-threshold slope S on a carrier density $N_D$ associated with the front-gate operation, back-gate operation, and double-gate operation.
Figure 43B:
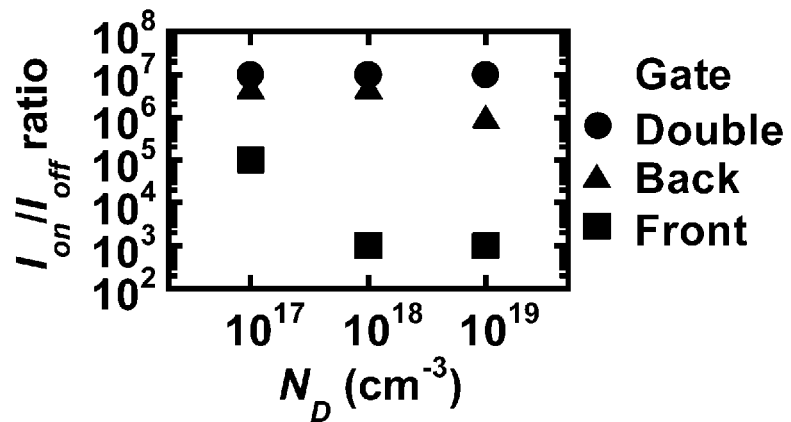
FIG. 43B is a graph illustrating dependency of a current on/off ratio $I_{on}/I_{off}$ on the carrier density $N_D$ associated with the front-gate operation, back-gate operation, and double-gate operation.

FIG. 43A shows dependency of the subthreshold slope S on the carrier density $N_D$ while the MISFET 90 including the approximately 9-nm-thick group III-V compound semiconductor layer 7 is in front-gate operation, back-gate operation, and double-gate operation. FIG. 43B shows dependency of the current on/off ratio $I_{on}/I_{off}$ on the carrier density $N_D$ while the MISFET 90 including the approximately 9-nm-thick group III-V compound semiconductor layer 7 is in front-gate operation, back-gate operation, and double-gate operation.

The dependency of the current on/off ratio $I_{on}/I_{off}$ and the subthreshold slope S on the carrier density $N_D$ is minimal in double-gate operation. This implies that even when the carrier density $N_D$ is increased to a high level for the purpose of reducing the source resistance and the drain resistance, the double-gate operation ensures a superior current on/off ratio $I_{on}/I_{off}$ and a superior subthreshold slope S.

Figure 44A:
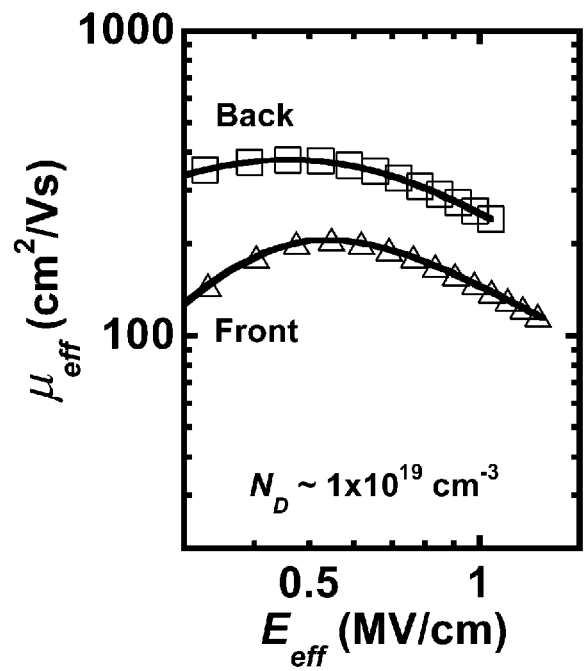
FIGS. 44A and 44B are graphs illustrating a relationship between an effective electron mobility $\mu_{eff}$ and an effective electric field $E_{eff}$ of the double-gate MISFET according to another embodiment.

Next, the MISFET 90 including the group III-V compound semiconductor layer 7 of approximately 9-nm-thick and of $1\times10^{19}$ $cm^{-3}$ carrier density $N_D$ was examined to ascertain how the effective electron mobility $\mu_{eff}$ and the effective electric field $E_{eff}$ of the MOS interfaces were related to one another while the MISFET 90 was in front-gate operation and back-gate operation. Results are shown in FIG. 44A. The results show high effective electron mobilities $\mu_{eff}$ at the back gate MOS interfaces. Thus, it has been confirmed that the back-gate MOS interfaces are superior in quality (flatness) to the front-gate MOS interfaces.

Figure 44B:
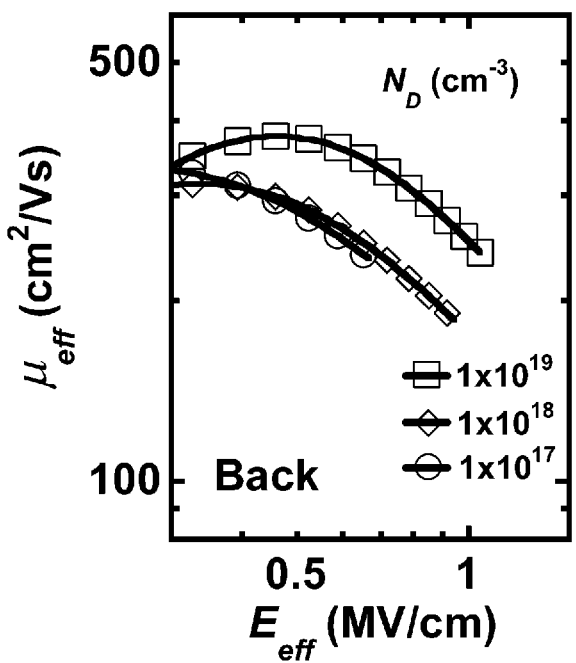
Figure 45:
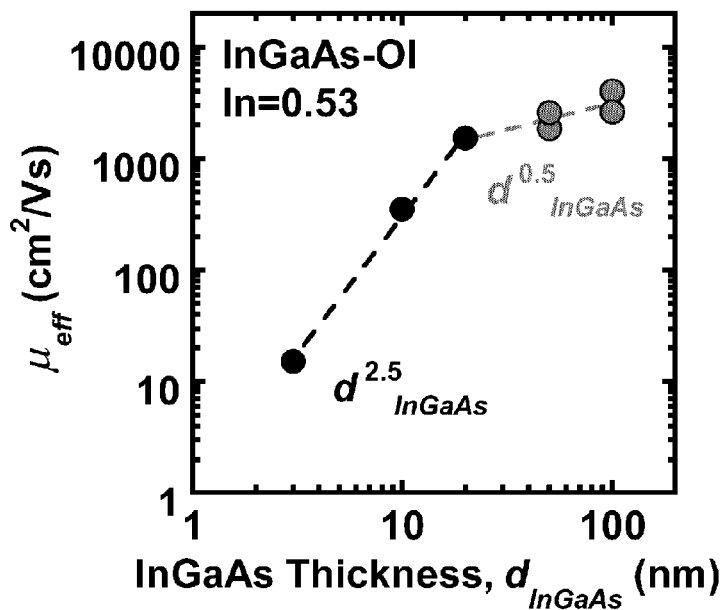
FIG. 45 is a graph illustrating a relationship between the effective electron mobility $\mu_{eff}$ and a thickness $d_{InGaAs}$ of the group III-V compound semiconductor layer associated with the back-gate operation.

Next, the MISFET 90 including the group III-V compound semiconductor layer 7 of approximately 9-nm-thick was examined to ascertain how the effective electron mobility $\mu_{eff}$ and the effective electric field $E_{eff}$ of the MOS interfaces were related to one another at a carrier density $N_D$ of $1\times10^{17}$ cm$^{-3}$, $1\times10^{18}$ cm$^{-3}$, and $1\times10^{19}$ cm$^{-3}$. Results are shown in FIG. 44B. As shown in FIG. 44B, the maximum effective electron mobility $\mu_{eff}$ (400 cm$^2$/Vs) is significantly lower than the electron mobility of the p-InGaAs bulk MISFET. This implies existence of some other mechanism of scattering of the carriers. Next, in order to study the cause of reduction of the effective electron mobility $\mu_{eff}$, an examination was carried out to ascertain how the effective electron mobility $\mu_{eff}$ and the thickness $d_{InGaAs}$ of the group III-V compound semiconductor layer 7 were related to one another while the MISFET 90 was in back-gate operation. Results are shown in FIG. 45. The results show that at 20 nm or less thickness $d_{InGaAs}$ of the group III-V compound semiconductor layer 7, the effective electron mobility $\mu_{eff}$ significantly decreases. At a thickness of equal to or less than 20 nm, carrier electrons expand throughout the channel layer. This presumably makes the carrier electrons subject to surface roughness and potential surface fluctuations existing at the MOS interfaces of the channel layer. It is also presumed that the channel layer is thoroughly depleted due to application of threshold voltage.

Figure 46:
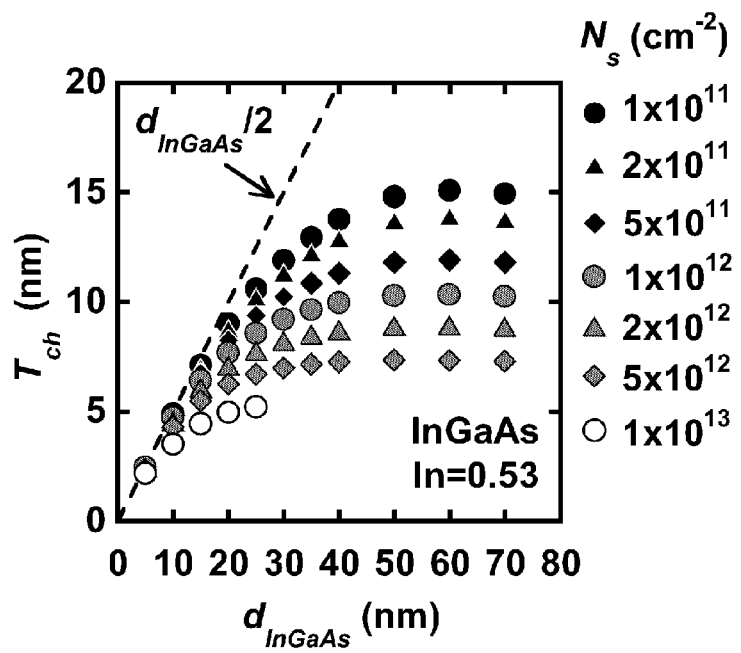
FIG. 46 is a graph illustrating a relationship between the thickness $d_{InGaAs}$ of the group III-V compound semiconductor layer and a thickness $T_{ch}$ of a channel layer theoretically calculated using the thickness $d_{InGaAs}$, and illustrating a relationship between the thickness $d_{InGaAs}$ and a surface carrier density.

FIG. 46 shows a relationship between the thickness $d_{InGaAs}$ of the group III-V compound semiconductor layer 7 and the thickness $T_{ch}$ of the channel layer theoretically calculated using the thickness $d_{InGaAs}$. FIG. 46 also shows a relationship between the thickness $d_{InGaAs}$ and the surface carrier density $N_S$ (cm$^{-2}$). The results of FIG. 46 show that when the thickness $d_{InGaAs}$ of the group III-V compound semiconductor layer 7 is 20 nm or less, the actual thickness of the channel layer is approximately identical to the theoretically calculated thickness $T_{ch}$ of the channel layer. When the group III-V compound semiconductor layer 7 has a large thickness $d_{InGaAs}$, the electron distribution in the channel layer is determined by the electric potential of the front-gate and the back-gate and by the distribution of the carriers (and dopants) in the channel. When, however, the thickness $d_{InGaAs}$ is as small as approximately equal to or less than the expansion of an electron wave function determined by the effective mass of the electrons in the channel and by the permittivity of the channel layer, the expansion of the electron wave function is determined by the thickness $d_{InGaAs}$ of the group III-V compound semiconductor layer 7, which serves as the channel. In this case, the electron wave function, at its feet, comes into contact with the MOS interfaces on both sides of the channel. This makes the interfaces more influential while, in contrast, maximizing the distribution of the carriers (electrons) of the channel layer at or adjacent the center of the channel layer.

That is, it is believed that the largest number of carriers (electrons) gather at half the thickness of the channel layer. The results of FIG. 46 show that at a thickness $d_{InGaAs}$ of equal to or less than 20 nm of the group III-V compound semiconductor layer 7, half the thickness $d_{InGaAs}$ is approximately identical to the theoretical value of the thickness $T_{ch}$ Accordingly, at a thickness $d_{InGaAs}$ of equal to or less than 20 nm, the carriers reach the surfaces of the channel layer and become subject to surface roughness and surface potential fluctuations.

(5-5) P-Channel MISFET
(5-5-1) Back-Gate MISFET

Figure 47:
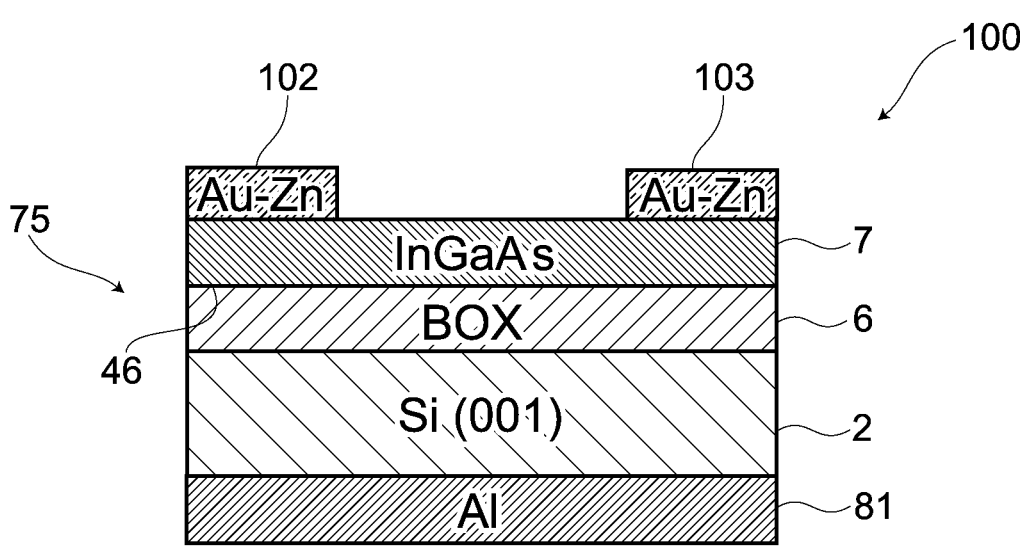
FIG. 47 is a schematic view of a cross-sectional structure of a p-channel back-gate MISFET.

Referring to FIG. 47, reference numeral 100 indicates a p-channel back-gate MISFET. For example, the semiconductor substrate 75 is fabricated in accordance with the process shown in FIGS. 23A to 23D. Over the group III-V compound semiconductor layer 7 of the semiconductor substrate 75, a source 102 of Au—Zn alloy and a drain 103 of Au—Zn alloy are disposed. The region in the group III-V compound semiconductor layer 7 defined between the source 102 and the drain 103 serves as a channel layer.

The semiconductor substrate 75, which may be used for fabricating the MISFET 100, includes the Si substrate 2, the $Al_2O_3$ oxide layer (indicated "BOX") 6 of a prescribed thickness, and the group III-V compound semiconductor layer 7 in this order starting at the Si substrate 2. The Al electrode 81 of a prescribed thickness is disposed over one surface of the Si substrate 2. The MISFET 100 includes the S treated surface 46 over the surface of the group III-V compound semiconductor layer 7 in contact with the oxide layer 6. The S treated surface 46 is obtained by terminating the surface of the group III-V compound semiconductor layer 7 with S atoms in an ammonium sulfide solution, similarly to "(5-1) Ammonium Sulfide Solution Treatment".

The MISFET 100 may be fabricated in the following manner. First, the semiconductor substrate 75 is prepared including the S treated surface 46 formed over the surface of the group III-V compound semiconductor layer 7 in contact with the oxide layer 6. Over the group III-V compound semiconductor layer 7 of the semiconductor substrate 75, a Au—Zn alloy layer (not shown) of Au—Zn alloy (95-5 weight %) is formed at low temperature (equal to or lower than 24° C. (at room-temperature)) using, for example, a resistive heating vapor deposition apparatus.

Next, a resist is applied over the Au—Zn alloy layer. The resist is then exposed through a prescribed mask to form a resist pattern. Then, the Au—Zn alloy layer is lifted off along with the resist excluding parts of the Au—Zn alloy layer corresponding to the portion where the source is to be formed and the portion where the drain is to be formed. Thus, the source 102 and the drain 103 are formed over the group III-V compound semiconductor layer 7. The formation of the source 102 as the source electrode and the drain 103 as the drain electrode may be by a usual etching back process or other various kinds of deposition methods. The channel length $L_G$ of the InGaAs film between the source 102 and the drain 103 was 500 μm. The width W of the channel layer was 100 μm. Finally, the Al electrode 81 as a gate electrode is disposed over one surface of the Si substrate 2. Thus, the MISFET 100 is fabricated.

(5-5-2) Estimation Results

Next, the p-channel back-gate MISFET 100 thus fabricated was subjected to various estimations. Specifically, in accordance with the above-described method for fabrication, a back-gate MISFET 100 was fabricated including the group III-V compound semiconductor layer 7 having a thickness $d_{InGaAs}$ of approximately 10 nm and a carrier density $N_A$ of $1\times10^{19}$ cm$^{-3}$. The carrier density $N_A$ was adjusted by Zn doping in the group III-V compound semiconductor layer 7 during its formation.

Figure 48A:
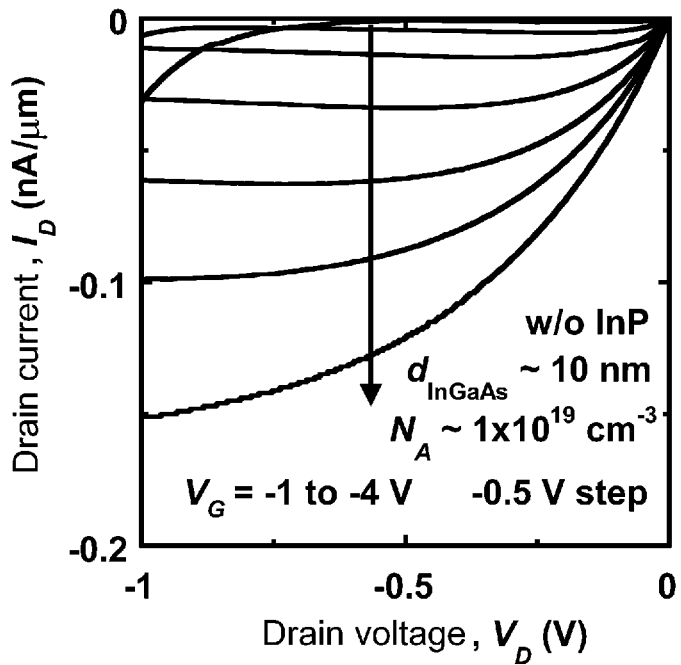
FIG. 48A is a graph illustrating a relationship (1) between drain voltage and drain current of the p-channel back-gate MISFET.

Then, the MISFET 100 was examined to ascertain how the drain voltage and the drain current were related to one another at room-temperature at a voltage of −1 V to −4 V applied to the Al electrode 81. Results are shown in FIG. 48A. The results show fair drain current-voltage characteristics, with a satisfactory saturation characteristic and a satisfactory pinch-off characteristic. As shown in FIG. 48A, an arrow points diagonally downward with lines crossing the arrow. These lines indicate the results of the estimation at back biases of −1 V, −1.5 V, −2 V, −2.5 V, −3 V, −3.5 V, and −4 V in this order starting at the beginning of the arrow.

Figure 48B:
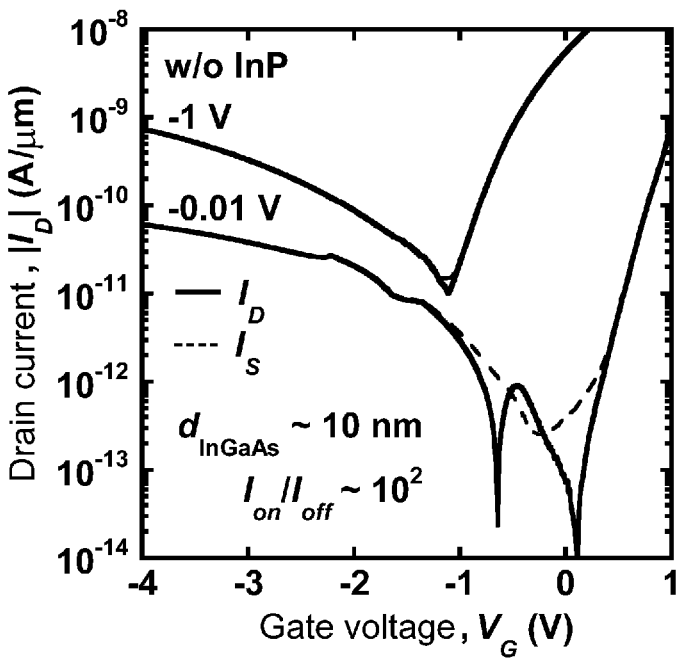
FIG. 48B is a graph illustrating a relationship (1) between gate voltage and drain current of the p-channel back-gate MISFET.

The MISFET 100 was also examined to ascertain how the gate voltage and the drain current were related to one another at room-temperature. Results are shown in FIG. 48B. FIG. 48B shows that the current on/off ratio $I_{on}/I_{off}$ is $10^2$, which is a ratio between "ON" and "OFF" of operation. This proves satisfactory transistor characteristics.

Figure 49A:
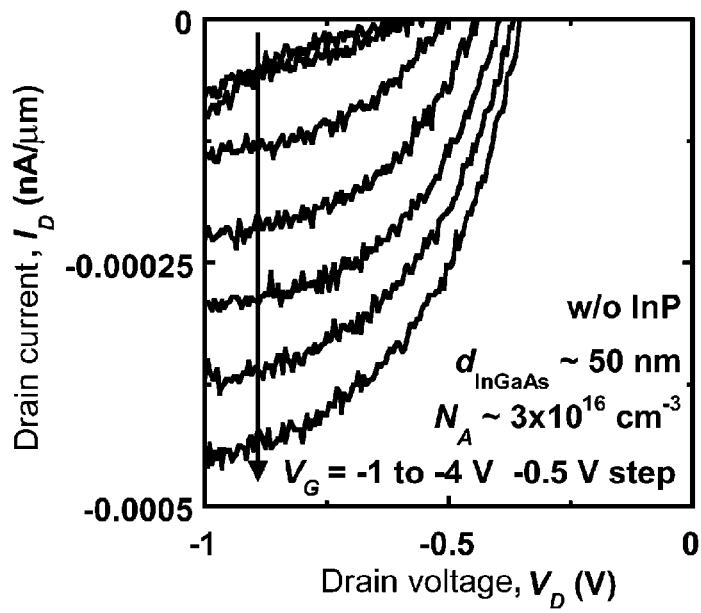
FIG. 49A is a graph illustrating a relationship (2) between drain voltage and drain current of the p-channel back-gate MISFET.

Next, in accordance with the above-described method for fabrication, a back-gate MISFET 100 was fabricated including the group III-V compound semiconductor layer 7 having a thickness $d_{InGaAs}$ of approximately 50 nm and a carrier density $N_A$ of $3\times10^{16}$ cm$^{-3}$. Then, the MISFET 100 was examined to ascertain how the drain voltage and the drain current were related to one another at room-temperature at a voltage of –1 V to –4 V applied to the Al electrode 81. Results are shown in FIG. 49A. The results show fair drain current-voltage characteristics, with a satisfactory saturation characteristic and a satisfactory pinch-off characteristic. Also in FIG. 49A, the lines crossing the arrow indicate the results of the estimation at back biases of –1 V, –1.5 V, –2 V, –2.5 V, –3 V, –3.5 V, and –4 V in this order starting at the beginning of the arrow.

Figure 49B:
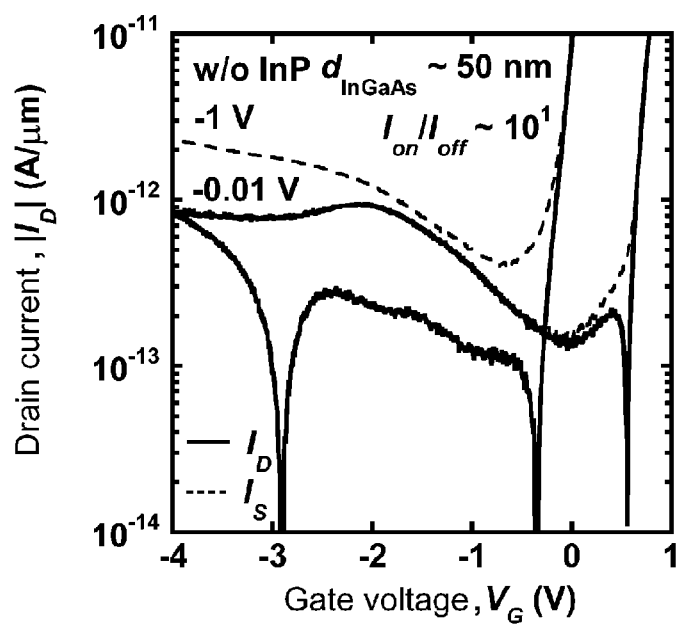
FIG. 49B is a graph illustrating a relationship (2) between gate voltage and drain current of the p-channel back-gate MISFET.

The MISFET 100 was also examined to ascertain how the gate voltage and the drain current were related to one another at room-temperature. Results are shown in FIG. 49B. FIG. 49B shows that the current on/off ratio $I_{on}/I_{off}$ is $10^1$, which is a ratio between "ON" and "OFF" of operation. This proves satisfactory transistor characteristics.

Figure 50A:
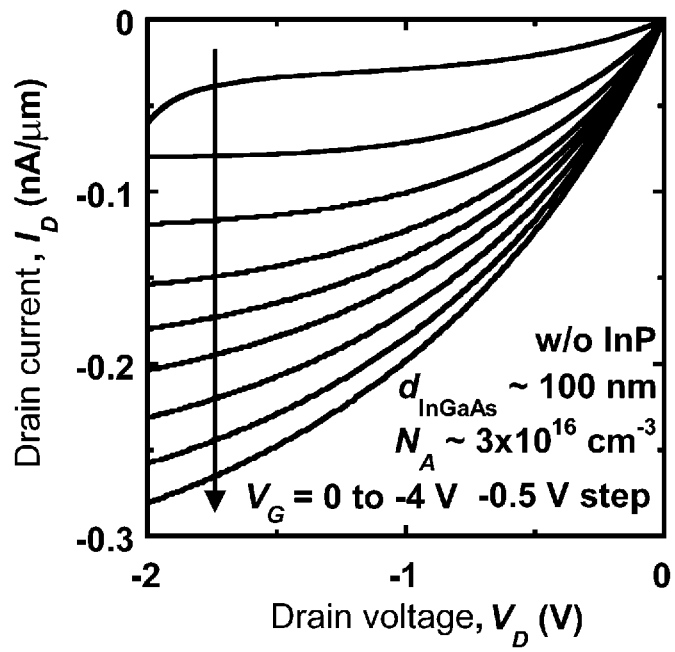
FIG. 50A is a graph illustrating a relationship (3) between drain voltage and drain current of the p-channel back-gate MISFET.

Next, in accordance with the above-described method for fabrication, a back-gate MISFET 100 was fabricated including the group III-V compound semiconductor layer 7 having a thickness $d_{InGaAs}$ of approximately 100 nm and a carrier density $N_A$ of $1\times10^{16}$ cm$^{-3}$. Then, the MISFET 100 was examined to ascertain how the drain voltage and the drain current were related to one another at room-temperature at a voltage of –1 V to –4 V applied to the Al electrode 81. Results are shown in FIG. 50A. The results show fair drain current-voltage characteristics, with a satisfactory saturation characteristic and a satisfactory pinch-off characteristic. Also in FIG. 50A, the lines crossing the arrow indicate the results of the estimation at back biases of –1 V, –1.5 V, –2 V, –2.5 V, –3 V, –3.5 V, and –4 V in this order starting at the beginning of the arrow.

Figure 50B:
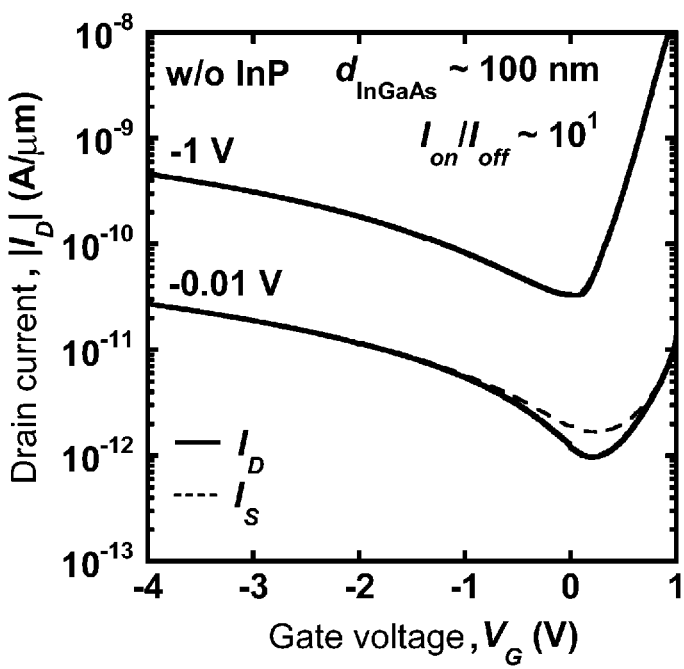
FIG. 50B is a graph illustrating a relationship (3) between gate voltage and drain current of the p-channel back-gate MISFET.

The MISFET 100 was also examined to ascertain how the gate voltage and the drain current were related to one another at room-temperature. Results are shown in FIG. 50B. FIG. 50B shows that the current on/off ratio $I_{on}/I_{off}$ is $10^1$, which is a ratio between "ON" and "OFF" of operation. This proves satisfactory transistor characteristics.

(5-5-3) P-Channel MISFET according to Another Embodiment

Figure 51:
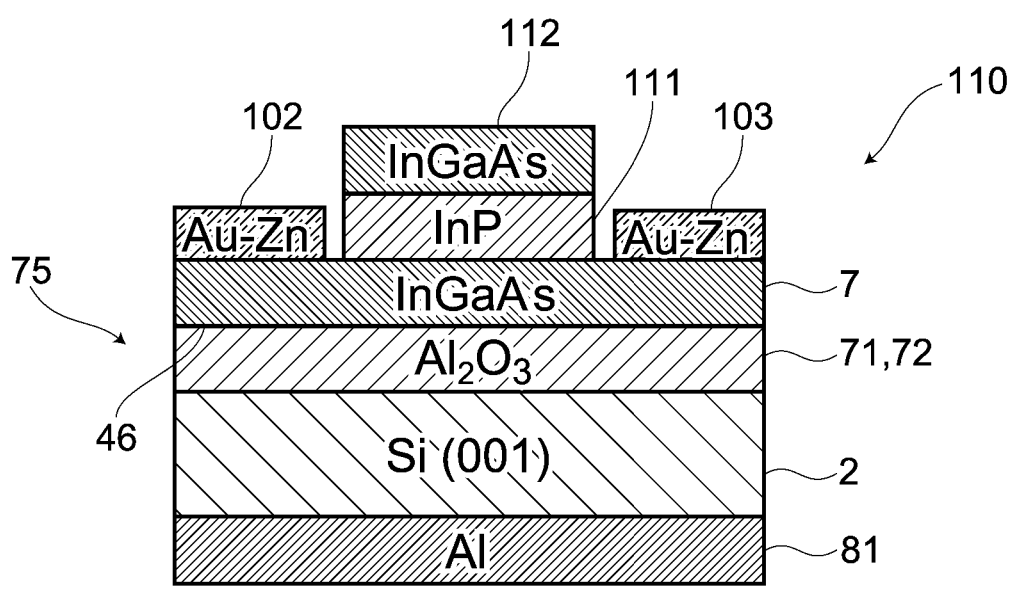
FIG. 51 is a schematic view of a cross-sectional structure of a p-channel MISFET according to another embodiment.

In FIG. 51, corresponding elements to those in FIG. 47 are designated by the same reference numerals. Referring to FIG. 51, reference numeral 110 indicates a p-channel MISFET. The p-channel MISFET 110 is different from the MISFET 100 in that an InP layer 111 and an InGaAs layer 112 are disposed over the group III-V compound semiconductor layer 7. The InP layer 111 and the InGaAs layer 112 cover the group III-V compound semiconductor layer 7 so as to eliminate or minimize oxidization of the group III-V compound semiconductor layer 7. Using only the InP layer 111 or using passivation layer can be enough to realize this effect. This minimizes scattering of the carriers on the surfaces of the group III-V compound semiconductor layer 7. The channel length $L_G$ of the InGaAs film between the source 102 and the drain 103 was 500 μm. The width W of the channel layer was 100 μm.

Figure 52A:
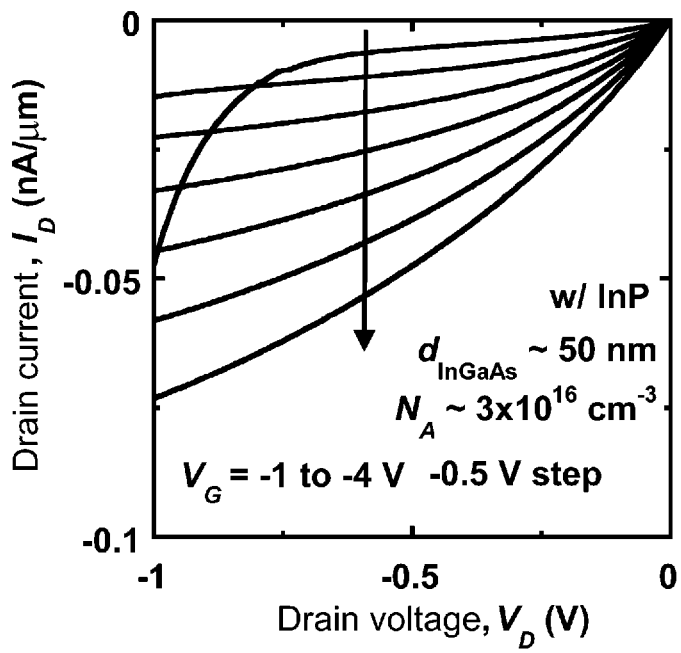
FIG. 52A is a graph illustrating a relationship (1) between drain voltage and drain current of the p-channel MISFET according to another embodiment.

The MISFET 110 was subjected to various estimations. Specifically, a MISFET 110 was fabricated including the group III-V compound semiconductor layer 7 having a thickness $d_{InGaAs}$ of approximately 50 nm and a carrier density $N_A$ of $3\times10^{16}$ cm$^3$. Then, the MISFET 110 was examined to ascertain how the drain voltage and the drain current were related to one another at room-temperature at a voltage of –1 V to –4 V applied to the Al electrode 81, similarly to the above-described cases. Results are shown in FIG. 52A. The results show fair drain current-voltage characteristics, with a satisfactory saturation characteristic and a satisfactory pinch-off characteristic. Also in FIG. 52A, the lines crossing the arrow indicate the results of the estimation at back biases of –1 V, –1.5 V, –2 V, –2.5 V, –3 V, –3.5 V, and –4 V in this order starting at the beginning of the arrow.

Figure 52B:
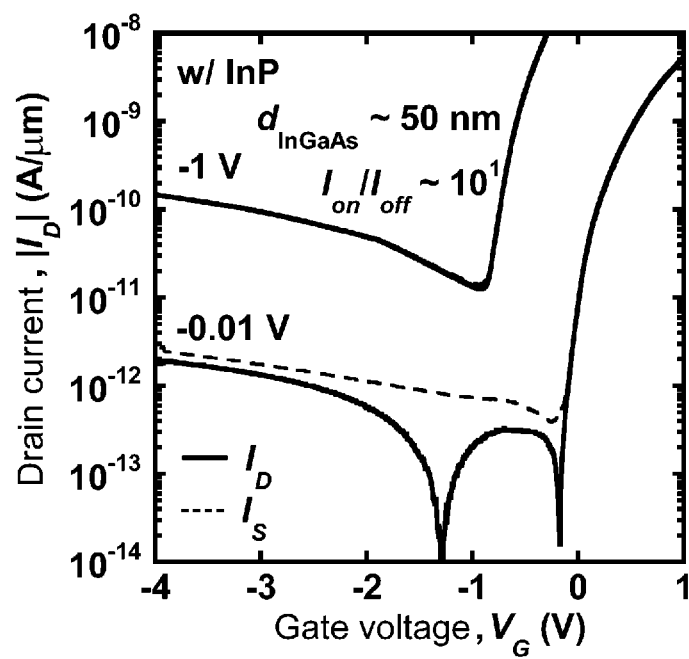
FIG. 52B is a graph illustrating a relationship (1) between gate voltage and drain current of the p-channel MISFET according to another embodiment.

The MISFET 110 was also examined to ascertain how the gate voltage and the drain current were related to one another at room-temperature. Results are shown in FIG. 52B. The results show that the current on/off ratio $I_{on}/I_{off}$ is $10^1$, which is a ratio between "ON" and "OFF" of operation. This proves satisfactory transistor characteristics.

Figure 53A:
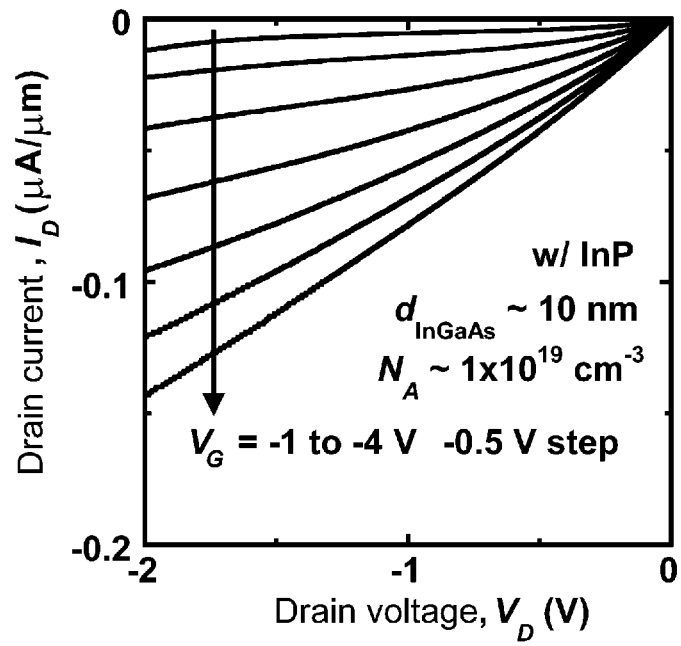
FIG. 53A is a graph illustrating a relationship (2) between drain voltage and drain current of the p-channel MISFET according to another embodiment.

A MISFET 110 was fabricated including the group III-V compound semiconductor layer 7 having a thickness $d_{InGaAs}$ of approximately 10 nm and a carrier density $N_A$ of $1\times10^{19}$ cm$^{-3}$. The channel length $L_G$ of the InGaAs film between the source 102 and the drain 103 was 500 μm. The width W of the channel layer was 100 μm. Then, the MISFET 110 was examined to ascertain how the drain voltage and the drain current were related to one another at room-temperature, similarly to the above-described cases. Results are shown in FIG. 53A. The results show fair drain current-voltage characteristics, with a satisfactory saturation characteristic and a satisfactory pinch-off characteristic. Also in FIG. 53A, the lines crossing the arrow indicate the results of the estimation at back biases of –1 V, –1.5 V, –2 V, –2.5 V, –3 V, –3.5 V, and –4 V in this order starting at the beginning of the arrow.

Figure 53B:
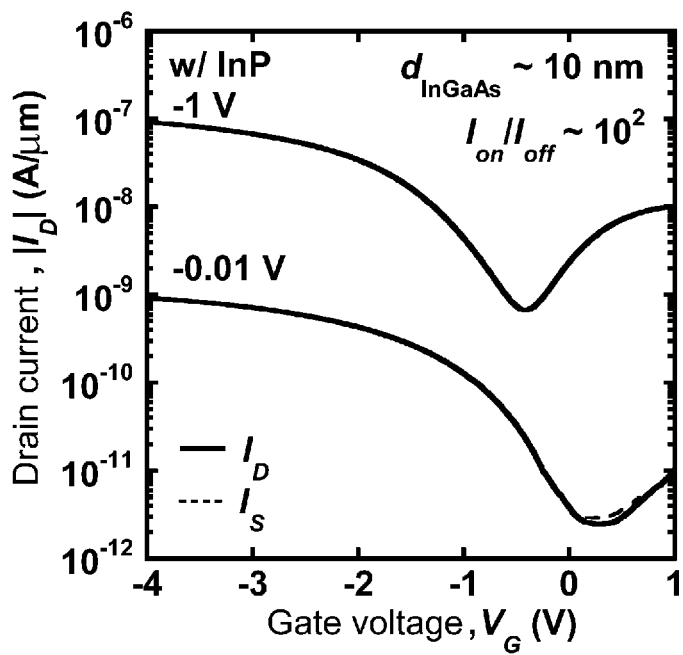
FIG. 53B is a graph illustrating a relationship (2) between gate voltage and drain current of the p-channel MISFET according to another embodiment.

The MISFET 110 was examined to ascertain how the gate voltage and the drain current were related to one another at room-temperature. Results are shown in FIG. 53B. The results show that the current on/off ratio $I_{on}/I_{off}$ is $10^2$, which is a ratio between "ON" and "OFF" of operation. This proves satisfactory transistor characteristics. The peak effective hole mobility of 44 cm$^2$/Vs was found and this value is very good compared to bulk mobility in InGaAs with $N_A$ of $1\times10^{19}$ cm$^{-3}$ of ~70-90 cm$^2$/Vs.

Thus, a p-channel MISFET was fabricated from the semiconductor substrate 75 used to fabricate the above-described n-channel MISFET, with InGaAs as the group III-V compound semiconductor layer 7. The process of fabricating the p-channel MISFET was the same as the process of fabricating the n-channel MISFET except for the materials of the source/drain electrodes. This ensures that an n-channel MISFET and a p-channel MISFET are simultaneously formed on a common substrate, and that the n-channel MISFET and the p-channel MISFET are coupled to one another so as to form a complementary circuit.

(5-6) Oxide Layer in Semiconductor Substrate

Figure 54A:
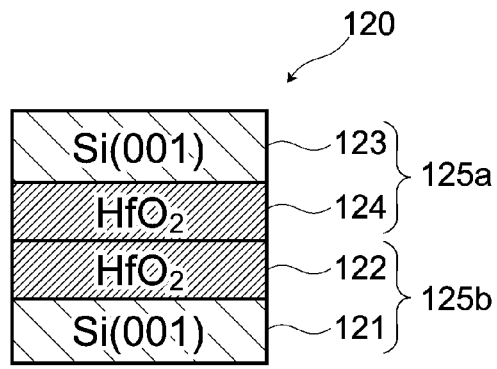
FIGS. 54A and 54B are schematic views of cross-sectional structures of sample substrates.

Next, an oxide layer of HfO$_2$ was examined to ascertain its bonding strength when used as an insulating layer for the bonding in the fabrication process of the semiconductor substrate. As shown in FIG. 54A, oxide layers (HfO$_2$) of approximately 2 nm to 3 nm thick were formed over opposing surfaces of Si substrates 121 and 123 using an ALD equipment (not shown). The Si substrate 123 and its corresponding oxide layer were formed into a first sample substrate 125a, while the Si substrate 121 and its corresponding oxide layer were formed into a second sample substrate 125b. Specifically, the ALD equipment used, as a raw material, methylcyclopentadienyl (Bis) methyoxy methyl hafnium HF CMMM Hf (Me) (MeO) (MeCp)$_2$. Under conditions of 350° C., a vacuum of equal to or less than 10 mbar, and a raw material temperature of 85° C., the ALD equipment ran 30 cycles of 1 second of 20 sccm to 100 sccm material supply, 1 second of nitrogen purging and vacuum-exhaust purging, 0.325 seconds of H$_2$O supply, and 0.5 seconds of nitrogen purging and vacuum-exhaust purging. Thus, oxide layers 122 and 124 of HfO$_2$ were formed respectively over the Si substrates 121 and 123. In addition, Tetrakis[EthylMethylAmino]Hafnium (TEMAHf), Hf[N(CH$_3$)(C$_2$H$_5$)]$_4$, and the like may be used instead of HfO$_2$.

Next, the oxide layers 122 and 124 were cleaned on their surfaces using an ultrasonic cleaner (EVG301, available from EV Group). Then, the oxide layer 122 of the Si substrate 121 and the oxide layer 124 of the Si substrate 123 were brought into close contact with one another at room-temperature so as to bond the first sample substrate 125a and the second sample substrate 125b to one another. Thus, the sample substrate 120 was fabricated as a laminate of the oxide layers 122 and 124 of HfO$_2$.

Figure 55A:
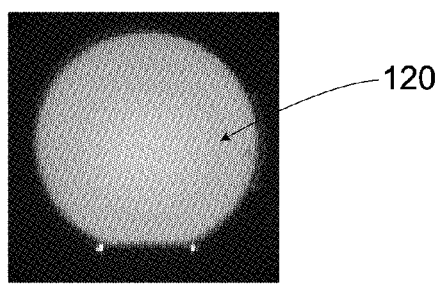
FIG. 55A is an IR photograph of a sample substrate of oxide layers of $HfO_2$ bonded to one another, illustrating a bonding condition of the oxide layers.

Then, the interface between the oxide layers 122 and 124 of the fabricated sample substrate 120 was observed through an IR camera. Results are shown in FIG. 55A. The results show that no air voids exist between the oxide layers 122 and 124 of HfO$_2$ in the sample substrate 120, and that the oxide layers 122 and 124 are closely bonded to one another. Thus, it has been confirmed that an oxide layer of HfO$_2$ can replace, for example, the oxide layers 6, 71, and 72 of Al$_2$O$_3$ of the semiconductor substrates 20, 30, and 75, and can be used to fabricate a semiconductor substrate.

Figure 54B:
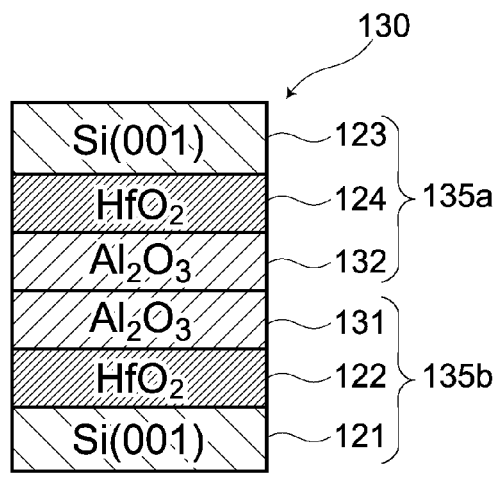
Figure 55B:
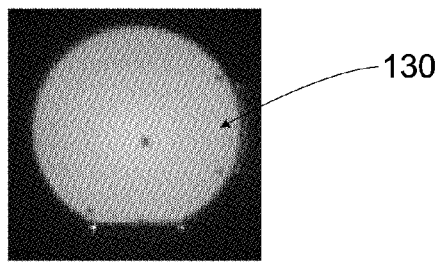
FIG. 55B is an IR photograph of a sample substrate of oxide layers of $HfO_2$ and $Al_2O_3$ bonded to one another, illustrating a bonding condition of the oxide layers.

Apart from the sample substrate 120, two Si substrates 121 and 123 were prepared as shown in FIG. 54B. Then, oxide layers 122 and 124 of HfO$_2$ were respectively formed over the Si substrates 121 and 123. Additionally, oxide layers 131 and 132 of Al$_2$O$_3$ were respectively formed over the oxide layers 122 and 124 of HfO$_2$ using the ALD equipment. Thus, a first sample substrate 135a and a second sample substrate 135b were fabricated. The oxide layer 131 of Al$_2$O$_3$ in the first sample substrate 135a and the oxide layer 132 of Al$_2$O$_3$ in the second sample substrate 135b were brought into close contact with one another into bonded state, followed by observation through an infrared camera for the bonding condition. Results are shown in FIG. 55B. The results show that no air bubbles exist between the oxide layers 131 and 132 of Al$_2$O$_3$ in the sample substrate 130, and that the oxide layers 131 and 132 are closely bonded to one another. Thus, it has been confirmed that even though the oxide layers 122 and 124 of HfO$_2$ are bonded, the oxide layers 131 and 132 of Al$_2$O$_3$ bond the first sample substrate 135a and the second sample substrate 135b to one another.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor substrate comprising:
   a substrate;
   an insulating layer over and in direct mechanical contact with the substrate, the insulating layer being made of an amorphous metal oxide; and
   a semiconductor layer having a first surface, the semiconductor layer being over and in direct mechanical contact at the first surface with the insulating layer, the semiconductor layer being formed by crystal growth, the crystal growth occurring from a second surface of the semiconductor layer opposite to the first surface of the semiconductor layer in contact with the insulating layer, wherein the substrate is made of Si, the semiconductor layer is made of InGaAs, and the second surface of the semiconductor layer has a flat and specular surface.

2. The semiconductor substrate according to claim 1, wherein the insulating layer is made of at least one of Al$_2$O$_3$, Ta$_2$O$_5$, ZrO$_2$, and HfO$_2$.

3. The semiconductor substrate according to claim 1, wherein the semiconductor layer comprises a surface in contact with the insulating layer and terminated with a sulfur atom.

4. A field-effect transistor comprising a source electrode and a drain electrode each electrically coupled to the semiconductor layer over the semiconductor substrate according to claim 1.

5. The field-effect transistor according to claim 4, further comprising a gate electrode over the substrate, wherein the insulating layer is partially a gate insulating layer.

6. The field-effect transistor according to claim 4, further comprising a gate electrode over the second surface of the semiconductor layer across a second insulating layer, the second surface of the semiconductor layer being opposite to the surface of the semiconductor layer in contact with the insulating layer,
   wherein the second insulating layer is partially a gate insulating layer.

7. The field-effect transistor according to claim 4, further comprising:
   a first gate electrode over the substrate; and
   a second gate electrode over the second surface of the semiconductor layer across a second insulating layer, the second surface of the semiconductor layer being opposite to the surface of the semiconductor layer in contact with the insulating layer,
   wherein at least one of the insulating layer and the second insulating layer is partially a gate insulating layer.

8. The field-effect transistor according to claim 4, wherein the semiconductor layer has a thickness of equal to or less than 20 nm.

9. An integrated circuit comprising the field-effect transistor according to claim 4.

10. The semiconductor substrate according to claim 1, wherein the insulating layer is made of at least one of La$_2$O$_3$ and Y$_2$O$_3$.

* * * * *